(12) United States Patent
Shin et al.

(10) Patent No.: US 10,381,345 B2
(45) Date of Patent: Aug. 13, 2019

(54) SEMICONDUCTOR DEVICE INCLUDING RESISTOR STRUCTURE

(71) Applicant: Samsung Electronics Co., Ltd., Suwon-si, Gyeonggi-do (KR)

(72) Inventors: Hong-sik Shin, Seoul (KR); Do-hyoung Kim, Hwaseong-si (KR); Doo-young Lee, Seoul (KR); Hyon-wook Ra, Hwaseong-si (KR); Seo-bum Lee, Seoul (KR); Won-hyuk Lee, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 36 days.

(21) Appl. No.: 15/850,243

(22) Filed: Dec. 21, 2017

(65) Prior Publication Data

US 2018/0211952 A1 Jul. 26, 2018

(30) Foreign Application Priority Data

Jan. 26, 2017 (KR) .................. 10-2017-0012959

(51) Int. Cl.
*H01L 27/06* (2006.01)
*H01L 29/78* (2006.01)
(Continued)

(52) U.S. Cl.
CPC .... *H01L 27/0629* (2013.01); *H01L 21/76805* (2013.01); *H01L 21/76831* (2013.01);
(Continued)

(58) Field of Classification Search
CPC .......... H01L 27/0629; H01L 21/76805; H01L 21/76831; H01L 21/76832; H01L 23/5226;
(Continued)

(56) References Cited

U.S. PATENT DOCUMENTS 6,764,966 B1 * 7/2004 En ...................... H01L 29/6656
257/E21.423
7,306,552 B2 12/2007 Choi et al.
(Continued)

FOREIGN PATENT DOCUMENTS

JP 2010-027874 A 2/2010
JP 5666354 B2 2/2015
KR 10-2008-0060320 A 7/2008

*Primary Examiner* — Allen L Parker
*Assistant Examiner* — Charles N Ausar-El
(74) *Attorney, Agent, or Firm* — Harness, Dickey & Pierce, P.L.C.

(57) ABSTRACT

Provided is a semiconductor device having an enhanced characteristic and a resistor structure satisfying a desired target resistor value of a resistor device. A semiconductor device includes: a lower interlayer insulating layer disposed on a substrate comprising a resistor area; a resistor structure comprising a resistor layer and an etch stop pattern sequentially stacked on the lower interlayer insulating layer of the resistor area; an upper interlayer insulating layer configured to cover the resistor structure and disposed on the lower interlayer insulating layer; a resistor contact structure configured to pass through the upper interlayer insulating layer and the etch stop pattern and contact the resistor layer; and a resistor contact spacer disposed between the upper interlayer insulating layer, the etch stop pattern, and the resistor contact structure.

20 Claims, 23 Drawing Sheets

(51) Int. Cl.
  *H01L 49/02* (2006.01)
  *H01L 21/768* (2006.01)
  *H01L 23/522* (2006.01)
  *H01L 23/528* (2006.01)
  *H01L 23/532* (2006.01)

(52) U.S. Cl.
  CPC .... *H01L 21/76832* (2013.01); *H01L 23/5226* (2013.01); *H01L 23/5228* (2013.01); *H01L 23/5283* (2013.01); *H01L 23/53295* (2013.01); *H01L 28/24* (2013.01); *H01L 29/785* (2013.01)

(58) Field of Classification Search
  CPC ............. H01L 23/5228; H01L 23/5283; H01L 23/53295; H01L 28/24
  See application file for complete search history.

(56) References Cited

U.S. PATENT DOCUMENTS

| | | | | |
|---|---|---|---|---|
| 7,354,838 B2* | 4/2008 | Kammler | ........ | H01L 21/823807 257/E21.438 |
| 8,477,006 B2* | 7/2013 | Yang | ........ | H01L 28/20 257/258 |
| 8,524,556 B1* | 9/2013 | Chiou | ........ | H01L 27/0629 257/380 |
| 8,779,526 B2* | 7/2014 | Hsu | ........ | H01L 27/0629 257/379 |
| 8,790,988 B2* | 7/2014 | Choi | ........ | H01L 28/20 438/382 |
| 8,859,386 B2 | 10/2014 | Lu et al. | | |
| 8,962,464 B1* | 2/2015 | Chang | ........ | H01L 21/76816 438/588 |
| 8,969,971 B2* | 3/2015 | Xiong | ........ | H01L 27/0629 257/213 |
| 9,406,770 B2 | 8/2016 | Song et al. | | |
| 9,991,330 B1* | 6/2018 | Edelstein | ........ | H01L 28/24 |
| 10,128,336 B2* | 11/2018 | Park | ........ | H01L 21/823425 |
| 2006/0054953 A1 | 3/2006 | Son et al. | | |
| 2009/0108415 A1* | 4/2009 | Lenski | ........ | H01L 29/6653 257/649 |
| 2009/0209100 A1* | 8/2009 | Chen | ........ | H01L 21/76831 438/675 |
| 2012/0231606 A1 | 9/2012 | Nguyen et al. | | |
| 2013/0277754 A1 | 10/2013 | Liang et al. | | |
| 2014/0167181 A1* | 6/2014 | Xiong | ........ | H01L 27/0629 257/379 |
| 2016/0020148 A1* | 1/2016 | Song | ........ | H01L 23/535 438/238 |
| 2016/0233310 A1 | 8/2016 | Lee et al. | | |
| 2016/0379871 A1* | 12/2016 | Tsai | ........ | H01L 21/76885 257/774 |
| 2017/0179032 A1* | 6/2017 | Chang | ........ | H01L 27/088 |
| 2017/0345759 A1* | 11/2017 | Lin | ........ | H01L 21/76897 |
| 2018/0190754 A1* | 7/2018 | Lin | ........ | H01L 28/24 |
| 2018/0337127 A1* | 11/2018 | Chang | ........ | H01L 29/0847 |

\* cited by examiner

SEMICONDUCTOR DEVICE INCLUDING RESISTOR STRUCTURE

CROSS-REFERENCE TO RELATED APPLICATION

This application claims the benefit of Korean Patent Application No. 10-2017-0012959, filed on Jan. 26, 2017, in the Korean Intellectual Property Office, the disclosure of which is incorporated herein in its entirety by reference.

BACKGROUND

Example embodiments of the inventive concepts relate to a semiconductor device. For example, at least some example embodiments relate to a semiconductor device including a resistor structure.

Semiconductor devices may include transistors that are active devices or diodes, and resistor devices or capacitor devices that are passive devices. Among these, resistor devices may be used to operate integrated circuits and may include metallic materials. In general, in a semiconductor device having a multilayer interconnection structure, a resistor device may be electrically connected through a contact structure.

SUMMARY

At least some example embodiments of inventive concepts provide a semiconductor device having a resistor structure including a resistor device electrically connected through a contact structure.

According to an example embodiment of the inventive concepts, a semiconductor device includes a lower interlayer insulating layer on a substrate, the substrate including a resistor area; a resistor structure including a resistor layer and an etch stop pattern sequentially stacked, in the resistor area, on the lower interlayer insulating layer; an upper interlayer insulating layer configured to cover the resistor structure and on the lower interlayer insulating layer; a resistor contact structure configured to pass through the upper interlayer insulating layer and the etch stop pattern and contact the resistor layer; and a resistor contact spacer between the upper interlayer insulating layer, the etch stop pattern, and the resistor contact structure, the resistor contact spacer including, a first resistor contact spacer, and a second resistor contact spacer between the first resistor contact spacer and the resistor contact structure, a top end of the second resistor contact spacer being lower than a top end of the first resistor contact spacer relative to the substrate.

According to another example embodiment of the inventive concepts, a semiconductor device includes a lower interlayer insulating layer configured to cover a plurality of gate structures and side walls of the plurality of gate structures, the plurality of gate structures being on a substrate, the substrate including a transistor area and a resistor area; a resistor structure including a resistor layer and an etch stop pattern sequentially stacked, in the resistor area, on the plurality of gate structures and the lower interlayer insulating layer; an upper interlayer insulating layer on the lower interlayer insulating layer so as to cover the resistor structure in the transistor area and the resistor area; contact structures including a resistor contact structure and a transistor contact structure, the resistor contact structure configured to pass through the upper interlayer insulating layer and the etch stop pattern and contact the resistor layer, and the transistor contact structure configured to pass through the upper interlayer insulating layer and the lower interlayer insulating layer and contact the substrate; a resistor contact spacer between the upper interlayer insulating layer, the etch stop pattern, and the resistor contact structure, the resistor contact spacer including a first resistor contact spacer and a second resistor contact spacer, the second resistor contact spacer being between the first resistor contact spacer and the resistor contact structure, a top end of the second resistor contact spacer being located at a lower level than a top end of the first resistor contact spacer; and a transistor contact spacer between the upper interlayer insulating layer, the etch stop pattern, and the transistor contact structure, transistor contact spacer including a first transistor contact spacer and a second transistor contact spacer, the second transistor contact spacer being between the first transistor contact spacer and the transistor contact structure, a top end of the second transistor contact spacer being located at a lower level than a top end of the first transistor contact spacer.

According to an example embodiment of the inventive concepts, a semiconductor device includes a plurality of resistor contact spacers each including a first resistor contact spacer and a second resistor contact spacer, the second resistor contact spacer being between the first resistor contact spacer and a respective one of a plurality of resistor contact structures, a top end of the second resistor contact spacer being located at a lower level than a top end of the first resistor contact spacer; and a plurality of transistor contact spacers each including a first transistor contact spacer and a second transistor contact spacer, the second transistor contact spacer being between the first transistor contact spacer and a respective one of a plurality of transistor contact structures, a top end of the second transistor contact spacer being located at a lower level than a top end of the first transistor contact spacer.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Example embodiments of the inventive concepts will be described with reference to accompanying drawings, for sufficient understanding of composition and effects of the inventive concepts.

Figure 1:
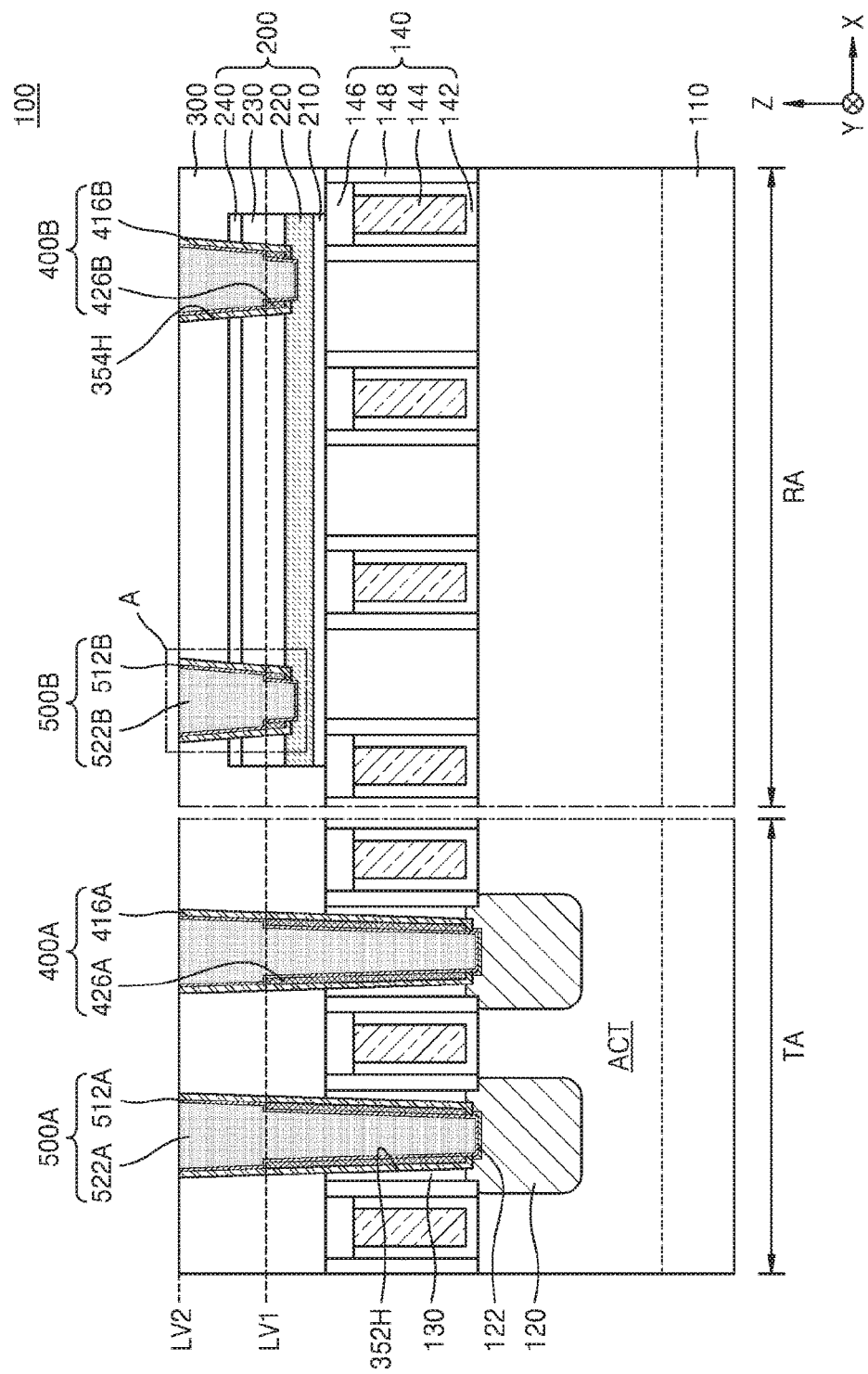
FIG. 1 is a cross-sectional view of a semiconductor device according to an example embodiment.

FIG. 1 is a cross-sectional view of a semiconductor device 100 according to an example embodiment.

Referring to FIG. 1, the semiconductor device 100 may include a substrate 110 including a transistor area TA and a resistor area RA. The substrate 110 may include an active area ACT in an upper part of the substrate 110. In some example embodiments, the active area ACT may be a fin-type active area (see FIG. 8) protruding perpendicular to a main surface of the substrate 110. The fin-type active area may extend along a direction parallel to the main surface of the substrate 110. A plurality of the fin-type active area may extend and be disposed at certain intervals.

The substrate 110 may include a semiconductor material. The substrate 110 may be formed of at least one of a Group III-V material and a Group IV material. The substrate 110 may include, for example, silicon (Si). Alternatively, the substrate 110 may include a semiconductor element, such as germanium (Ge), or a compound semiconductor material, such as silicon germanium (SiGe), silicon carbide (SiC), gallium arsenide (GaAs), indium arsenide (InAs), or indium phosphide (InP). The Group III-V material may be a binary, ternary, or quaternary system compound including at least one Group III element and at least one Group V element. The Group III-V material may be a component including at least one of In, Ga, and Al as a Group III element, and at least one of As, P, and Sb as a Group V element. For example, the Group III-V material may be selected from among InP, $In_zGa_{1-z}As$ ($0 \leq z \leq 1$), and $Al_zGa_{1-z}As$ ($0 \leq z \leq 1$). The binary system compound may be one of, for example, InP, GaAs, InAs, InSb, and GaSb. The ternary system compound may be one of InGaP, InGaAs, AlInAs, InGaSb, GaAsSb, and GaAsP. The Group IV material may be Si or Ge. However, examples of the Group III-V material and the Group IV material usable in a semiconductor device are not limited thereto. The Group III-V material and the Group IV material, such as Ge, may be used as a channel material for preparing a high-speed transistor having low power consumption. A high-performance complementary metal-oxide semiconductor (CMOS) may be formed by using a semiconductor substrate formed of a Group III-V material, such as GaAs, having high electron mobility as compared to a Si substrate, and a semiconductor substrate formed of a semiconductor material, such as Ge, having high hole mobility as compared to a Si substrate. In some example embodiments, when an N-channel metal oxide semiconductor (NMOS) transistor is formed over the substrate 110, the substrate 110 may be formed of any one of the Group III-V materials stated above. In other example embodiments, when a P-channel metal oxide semiconductor (PMOS) transistor is formed over the substrate 110, at least a part of the substrate 110 may be formed of Ge. In some example embodiments, the substrate 110 may have a silicon-on-insulator (SOI) structure or a germanium-on-insulator (GOI) structure. For example, the substrate 110 may include a buried oxide (BOX) layer. The substrate 110 may include a conductive region, for example, an impurity-doped well. The substrate 110 may have any one of various device separating structures, such as a shallow trench isolation (STI) structure and a deep trench isolation (DTI) structure.

A gate structure 140 may be formed on the substrate 110. In some example embodiments, the gate structure 140 formed in the resistor area RA may be a dummy gate structure that does not form a transistor. In some example embodiments, the gate structure 140 formed in the resistor area RA may be a portion extending from the gate structure 140 that forms a transistor in the transistor area TA.

The gate structure 140 may include a gate dielectric layer 142, a gate electrode 144, a gate capping layer 146, and a pair of gate spacers 148. The gate electrode 144 may extend over the active area ACT in one direction (a Y direction). The gate dielectric layer 142 may be disposed between the active area ACT and the gate electrode 144. The gate capping layer 146 may be disposed on the gate electrode 144. The pair of gate spacers 148 may be formed on two side walls of the gate electrode 144. In some example embodiments, the gate dielectric layer 142 may be disposed between the gate electrode 144 and the active area ACT in one direction (a Z direction). In some example embodiments, a top surface of the gate spacer 148 may be higher than a top surface of the gate dielectric layer 142 and a top surface of the gate electrode 144. In some example embodiments, the gate capping layer 146 may be disposed so as to cover both the gate dielectric layer 142 and the gate electrode 144. In some example embodiments, the pair of gate spacers 148 may be together formed on two side walls of the gate electrode 144 and two side walls of the gate capping layer 146.

In the active area ACT, a pair of impurity areas 120 may be formed on two sides of the gate structure 144. The impurity areas 120 may include an N- or P-type impurity. The impurity areas 120 may include an N- or P-type impurity that is doped in the substrate 110. The N-type impurity may include phosphorus (P) or arsenic (As). The P-type impurity may include boron (B). The impurity areas 120 may include a semiconductor layer epitaxially grown from the active area ACT. The impurity areas 120 may have an embedded SiGe structure including a plurality of epitaxially grown SiGe layers, or may include an epitaxially grown Si layer or an epitaxially grown SiC layer.

A transistor may be formed at an area where the active area ACT and the gate electrode 144 cross each other. The impurity areas 120 may be source/drain areas of the transistor. In some example embodiments, the transistor may be a MOS transistor having a 3-dimensional (3D) structure in which a channel is formed at a top surface and two side surfaces of the fin-type active area. The MOS transistor may be an NMOS or PMOS transistor.

The gate dielectric layer 142 may be formed of silicon oxide, silicon nitride, silicon oxynitride, gallium oxide, germanium oxide, a high dielectric material, or a combination thereof.

The gate dielectric layer 142 may include an interface layer and a high dielectric layer formed on the interface layer. The interface layer may be disposed between the active area ACT and a bottom surface of the gate electrode 144 so as to face the bottom surface of the gate electrode 144. The high dielectric layer may be formed to face the bottom surface and the two side walls of the gate electrode 144. In some example embodiments, only the high dielectric layer of the gate dielectric layer 142 may be formed on inner side walls of a pair of gate spacers 148, whereas the interface layer may not be formed.

The interface layer may be formed of a low dielectric material having a dielectric constant lower than or equal to about 9, such as silicon oxide, silicon nitride, silicon oxynitride, gallium oxide, or germanium oxide, but is not limited thereto. The interface layer may be an oxide, a nitride, or an oxynitride of a material forming the substrate 110. The interface layer may have a thickness of about 5 Å to 20 Å, but is not limited thereto. The interface layer may be formed by a thermal oxidation process, an atomic layer deposition (ALD) process, a chemical vapor deposition (CVD) process, or a physical vapor deposition (PVD) process.

The high dielectric layer may be formed of a high dielectric material having a dielectric constant of about 10 to 25, which is higher than that of the interface layer. The high dielectric layer may be formed of a material having a higher dielectric constant than, for example, a silicon oxide film and a silicon nitride film. The high dielectric layer may be formed of a material selected from among hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and a compound thereof, but a material forming the high dielectric layer is not limited thereto. The high dielectric layer may be formed by an ALD process, a CVD process, or a PVD process. The high dielectric layer may have a thickness of about 10 Å to 40 Å, but is not limited thereto.

The gate electrode 144 may be formed of, for example, at least one metal selected from among Ti, Ta, Al, W, Ru, Nb, Mo, Hf, Ni, Co, Pt, Yb, Tb, Dy, Er, and Pd, a metal nitride including the at least one metal, or a metal compound such as a carbon-doped metal or a carbon-doped metal nitride.

The gate electrode 144 may be a single layer or a multilayer including a plurality of layers. The gate electrode 144 may include, for example, a work function-adjusting metal-containing layer and a gap-filling metal-containing layer for filling a space formed at an upper portion of the work function-adjusting metal-containing layer.

In some example embodiments, the gate electrode 144 may have a structure in which a metal nitride layer, a metal layer, a conductive capping layer, and a gap-fill metal layer are sequentially stacked on each other. The metal nitride layer and the metal layer may each include at least one metal element selected from among Ti, W, Ru, Nb, Mo, Hf, Ni, Co, Pt, Yb, Tb, Dy, Er, and Pd. The metal nitride layer and the metal layer may each be formed by an ALD process, a metal organic ALD (MOALD) process, or a metal organic CVD (MOCVD) process. The conductive capping layer may operate as a protective layer reducing a probability of (or, alternatively, preventing) oxidation of a surface of the metal layer. Also, the conductive capping layer may operate as a wetting layer enabling another conductive layer to be easily deposited over the metal layer. The conductive capping layer may be formed of a metal nitride, such as TiN or TaN, or a combination thereof, but is not limited thereto. The gap-fill metal layer may extend over the conductive capping layer. The gap-fill metal layer may be a W layer. The gap-fill metal layer may be formed by an ALD process, a CVD process, or a PVD process. The gap-fill metal layer may embed, without a void, a recess space formed by a stepped portion between regions at a top surface of the conductive capping layer. In some example embodiments, the gate electrode 144 may have a stacked structure of TiAlC/TiN/W, a stacked structure of TiN/TaN/TiAlC/TiN/W, or a stacked structure of TiN/TaN/TiN/TiAlC/TiN/W. In such stacked structures, a TiAlC layer or a TiN layer may operate as a work function-adjusting metal-containing layer.

The gate capping layer 146 and/or the gate spacers 148 may include, for example, a silicon nitride film, a silicon oxynitride film, a carbon-containing silicon oxynitride film, or a composite film thereof. In some example embodiments, the gate spacers 148 may have an air gap therein or include a low dielectric film.

In some example embodiments, the semiconductor device 100 may further include a nano-sheet stacked structure facing a top surface of the active area ACT at a location spaced apart from the top surface of the active area ACT. The nano-sheet stacked structure may include a plurality of nano-sheets extending in parallel to the top surface of the active area ACT. The plurality of nano-sheets may include a channel region. The gate electrode 144 may surround at least a part of the channel region. The nano-sheet may be formed of a Group IV compound semiconductor, a Group IV-IV compound semiconductor, or a Group III-V compound semiconductor. For example, the nano-sheet may be formed of Si, Ge, or SiGe, or may be formed of InGaAs, InAs, GaSb, InSb, or a combination thereof. When the semiconductor device 100 further includes the nano-sheet stacked structure, the gate dielectric layer 142 may be disposed between the channel region and the gate electrode 144. The impurity areas 120 may contact two end portions of the plurality of nano-sheets, and the two end portions of the plurality of nano-sheets, which are adjacent to the impurity areas 120, may be covered by the insulating spacers covering side walls of the gate electrode 144. A pair of inner insulating spacers may be formed between the active area ACT and the nano-sheet. The pair of inner insulating spacers may be disposed between the gate electrode 144 and the impurity areas 120. The inner insulating spacers may be formed of a material different from that of the gate electrode 144. The inner insulating spacer may be formed of a material having a lower dielectric constant than that of a material forming the gate electrode 144. For example, the inner insulating spacer may be formed of an oxide of a material forming the nano-sheet, but is not limited thereto. The gate dielectric layer 142 may extend from a surface of the channel region of the nano-sheet to a surface of a side wall of the inner insulating spacer so as to be disposed between the gate electrode 144 and the inner insulating spacer, between the active area ACT and the nano-sheet.

A lower interlayer insulating layer 130 covering side walls of the gate structure 140 may be formed on the substrate 110. The lower interlayer insulating layer 130 may cover the gate spacers 148 at opposite sides of the gate electrode 144. The lower interlayer insulating layer 130 may include a silicon oxide film such as FSG (Fluoro Silicate Glass) or TEOS (Tetra Ethyl Ortho Silicate), but example embodiments of the inventive concepts are not limited thereto. A top surface of the lower interlayer insulating layer 130 may be at the same level as that of a top surface of the gate structure 140. That is, the top surface of the lower interlayer insulating layer 130 may have the same level as that of a top surface of the gate capping layer 146 and/or top surfaces of the gate spacers 148. Thus, the top surface of the lower interlayer insulating layer 130, the top surface of the gate capping layer 146, and the top surfaces of the gate spacers 148 may together form a co-planar surface in parallel to a main surface of the substrate 110.

A resistor structure 200 may be disposed in the resistor area RA on portions of the lower interlayer insulating layer 130 and the gate structure 140. The resistor structure 200 may include a resistor layer 220 and an etch stop pattern 230. In some example embodiments, the resistor structure 200 may further include a lower buffer insulating pattern 210 located below the resistor layer 220 and/or an upper buffer insulating pattern 240 located above the etch stop pattern 230. In some example embodiments, the lower buffer insulating pattern 210, the resistor layer 220, the etch stop pattern 230, and the upper buffer insulating pattern 240 may have the same planar area. The lower buffer insulating pattern 210 may have, for example, a thickness from about 10 Å to about 100 Å. The resistor layer 220 may have, for example, a thickness from about 50 Å to about 500 Å. The etch stop pattern 230 may have, for example, a thickness from about 100 Å to about 500 Å. In some example embodiments, the etch stop pattern 230 may be thicker than the resistor layer 220. The upper buffer insulating pattern 240 may have, for example, a thickness from about 10 Å to about 100 Å.

The resistor layer 220 may include a metal-based material such as a metal, a conductive metal nitride, or a metal silicide. In some example embodiments, the resistor layer 220 may include tungsten silicide (WSi) or titanium nitride (TiN). The etch stop pattern 230 may include, for example, silicon nitride. At least one of the lower buffer insulating pattern 210 and the upper buffer insulating pattern 240 may include, for example, silicon oxide. In some example embodiments, at least one of the lower buffer insulating pattern 210 and the upper buffer insulating pattern 240 may include silicon oxide of a greater density than that of the lower interlayer insulating layer 130 and an upper interlayer insulating layer 300.

The upper interlayer insulating layer 300 covering the resistor structure 200 of the resistor area RA and disposed on the lower interlayer insulating layer 130 and the gate structure 140 may be formed in the transistor area TA and the resistor area RA. The upper interlayer insulating layer 300 may include, for example, silicon oxide.

A transistor contact hole 352H passing through the upper interlayer insulating layer 300 and the lower interlayer insulating layer 130 and exposing a portion of the impurity areas 120 through a bottom surface thereof may be formed in the transistor area TA. Also, a resistor contact hole 354H passing through the upper interlayer insulating layer 300, the upper buffer insulating pattern 240, and the etch stop pattern 230 and exposing a portion of the resistor layer 220 through a bottom surface thereof may be formed in the resistor area RA. In some example embodiments, the transistor contact hole 352H and the resistor contact hole 354H may respectively extend into the impurity areas 120 and the resistor layer 220. That is, in some example embodiments, the bottom surfaces of the transistor contact hole 352H and the resistor contact hole 354H may be at a lower level than uppermost surfaces of the impurity areas 120 and the resistor layer 220, respectively.

A transistor contact spacer 400A and a resistor contact spacer 400B may be respectively formed on inner walls of the transistor contact hole 352H and the resistor contact hole 354H. The transistor contact spacer 400A may include a first transistor contact spacer 416A covering an inner wall of the transistor contact hole 352H, and a second transistor contact spacer 426A covering the first transistor contact spacer 416A. The resistor contact spacer 400B may include a first resistor contact spacer 416B covering inner walls of the resistor contact hole 354H, and a second resistor contact spacer 426B covering the first resistor contact spacer 416B. In some example embodiments, the transistor contact spacer 400A and the resistor contact spacer 400B may respectively extend into the impurity areas 120 and the resistor layer 220. That is, in some example embodiments, bottom surfaces of the transistor contact spacer 400A and the resistor contact spacer 400B may be at a lower level than uppermost surfaces of the impurity areas 120 and the resistor layer 220, respectively.

The first transistor contact spacer 416A and the first resistor contact spacer 416B may include the same material. Also, the second transistor contact spacer 426A and the second resistor contact spacer 426B may include the same material. The first transistor contact spacer 416A and the first resistor contact spacer 416B may include, for example, an oxide. The second transistor contact spacer 426A and the second resistor contact spacer 426B may include, for example, a nitride.

The first transistor contact spacer 416A and the first resistor contact spacer 416B may have, for example, a thickness in a range of about 10 Å to about 50 Å. The second transistor contact spacer 426A and the second resistor contact spacer 426B may have, for example, a thickness in a range of about 15 Å to about 70 Å.

In some example embodiments, thicknesses of the first transistor contact spacer 416A and the first resistor contact spacer 416B may have smaller values than those of thicknesses of the second transistor contact spacer 426A and the second resistor contact spacer 426B.

A transistor contact structure 500A filling the transistor contact hole 352H and contacting a portion of the impurity areas 120 may be formed in the transistor contact hole 352H. A resistor contact structure 500B filling the resistor contact hole 354H and contacting a portion of the resistor layer 220 may be formed in the resistor contact hole 354H. In some example embodiments, the transistor contact structure 500A and the resistor contact structure 500B may respectively extend into the impurity areas 120 and the resistor layer 220. That is, in some example embodiments, bottom surfaces of the transistor contact structure 500A and the resistor contact structure 500B may be at a lower level than those of the uppermost surfaces of the impurity areas 120 and the resistor layer 220, respectively. In some example embodiments, the transistor contact structure 500A and the resistor contact structure 500B may respectively extend further into the impurity areas 120 and the resistor layer 220 than the transistor contact spacer 400A and the resistor contact spacer 400B, respectively. That is, in some example embodiments, the bottom surfaces of the transistor contact structure 500A and the resistor contact structure 500B may be at a lower level than the bottom surfaces of the transistor contact spacer 400A and the resistor contact spacer 400B, respectively.

The transistor contact structure 500A may include a transistor contact barrier layer 512A and a transistor contact core layer 522A. The resistor contact structure 500B may include a resistor contact barrier layer 512B and a resistor contact core layer 522B.

The transistor contact barrier layer 512A and the resistor contact barrier layer 512B may include the same material. The transistor contact barrier layer 512A and the resistor contact barrier layer 512B may include a metal or a conductive metal nitride. The transistor contact barrier layer 512A and the resistor contact barrier layer 512B may include, for example, Ti, Ta, TiN, TaN, or a combination thereof. The transistor contact core layer 522A and the resistor contact core layer 522B may include the same material. The transistor contact core layer 522A and the resistor contact core layer 522B may include, for example, a metallic material such as W, Cu, Ti, Ta, Ru, Mn, or Co, a metal nitride such as TiN, TaN, CoN, or WN, or an alloy such as CoWP (Cobalt Tungsten Phosphide), CoWB (Cobalt Tungsten Boron), or CoWBP (Cobalt Tungsten Boron Phosphide).

The transistor contact barrier layer 512A may be formed to conformally cover a top surface of the transistor contact spacer 400A covering the inner wall of the transistor contact hole 352H, and a top surface of a portion of the impurity areas 120 exposed through the bottom surface of the transistor contact hole 352H. The transistor contact core layer 522A may be formed so as to cover a top surface of the transistor contact barrier layer 512A and fill the transistor contact hole 352H. Thus, the transistor contact barrier layer 512A may cover side and bottom surfaces of the transistor contact core layer 522A.

The second transistor contact spacer 426A may be disposed between the first transistor contact spacer 416A and the transistor contact structure 500A. A top end of the second transistor contact spacer 426A may be located at a first level LV1. A top end of the first transistor contact spacer 416A may be located at a second level LV2 higher than the first level LV1. That is, a level of the top end of the second transistor contact spacer 426A may be lower than a level of the top end of the first transistor contact spacer 416A. The first transistor contact spacer 416A may, in a perpendicular direction (a Z direction), extend farther from a main surface of the substrate 110 than the second transistor contact spacer 426A, such that the top end of the first transistor contact spacer 416A may be located at the second level LV2 that is the same level as a top surface of the upper interlayer insulating layer 300. A top end of the second transistor contact spacer 426A may be located at the first level LV1 that is a level between the bottom and top surfaces of the upper interlayer insulating layer 300.

Thus, sides of a top portion of the transistor contact structure 500A may contact the first transistor contact spacer 416A, and sides of a bottom portion thereof may contact the second transistor contact spacer 426A. In this regard, the bottom portion of the transistor contact structure 500A may mean a portion of the transistor contact structure 500A below the first level LV1, and the top portion of the transistor contact structure 500A may mean a portion thereof above the first level LV1.

In some example embodiments, a silicide layer 122 may be disposed on the transistor contact structure 500A, i.e. between the transistor contact barrier layer 512A and the impurity areas 120. The silicide layer 122 may include, for example, tungsten silicide (WSi), titanium silicide (TiSi), a cobalt silicide (CoSi), or nickel silicide (NiSi). In some example embodiments, the silicide layer 122 may be a metal silicide of a metal element included in the transistor contact barrier layer 512A. For example, when the transistor contact barrier layer 512A includes Ti, TiN, or a combination thereof, the silicide layer 122 may include titanium silicide.

The bottom surface of the second transistor contact spacer 426A may contact the first transistor contact spacer 416A and may be covered by the first transistor contact spacer 416A. The top surface of the second transistor contact spacer 426A may contact the transistor contact structure 500A and may be covered by the transistor contact structure 500A. The second transistor contact spacer 426A may have a cylindrical shape and may be hollow. An inner wall and a top surface of the second transistor contact spacer 426A having the cylindrical shape may be covered by the transistor contact barrier layer 512A of the transistor contact structure 500A, and an outer wall and a bottom surface thereof may be covered by the first transistor contact spacer 416A.

The second resistor contact spacer 426B may be disposed between the first resistor contact spacer 416B and the resistor contact structure 500B. A top end of the second resistor contact spacer 426B may be located at the first level LV1. A top end of the first resistor contact spacer 416B may be located at the second level LV2 that is higher than the first level LV1. That is, a level of the top end of the second resistor contact spacer 426B may be lower than that of the top end of the first resistor contact spacer 416B. That is, the first resistor contact spacer 416B may, in the perpendicular direction (the Z direction), extend farther from the main surface of the substrate 110 than the second resistor contact spacer 426B, such that the top end of the first resistor contact spacer 416B may be located at the second level LV2 that is the same level as the top surface of the upper interlayer insulating layer 300. The top end of the second resistor contact spacer 426B may be located at the first level LV1 that is a level between bottom and top surfaces of the etch stop pattern 230.

Therefore, the top ends of the second transistor contact spacer 426A and the second resistor contact spacer 426B may be located at the first level LV1, and the top ends of the first transistor contact spacer 416A and the first resistor contact spacer 416B may be located at the second level LV2.

Sides of a top portion of the resistor structure 500B may contact the first resistor contact spacer 416B, and sides of a bottom portion thereof may contact the second resistor contact spacer 426B. In this regard, the bottom portion of the resistor structure 500B may mean a portion of the resistor structure 500B below the first level LV1, and the top portion of the resistor structure 500B may mean a portion thereof above the first level LV1.

The bottom surface of the second resistor contact spacer 426B may contact the first resistor contact spacer 416B and may be covered by the first resistor contact spacer 416B. The top surface of the second resistor contact spacer 426B may contact the resistor structure 500B and may be covered by the resistor structure 500B. The second resistor contact spacer 426B may have a cylindrical shape and may be hollow. An inner wall and a top surface of the second resistor contact spacer 426B having the cylindrical shape may be covered by the resistor contact barrier layer 512B of the resistor structure 500B, and an outer wall and a bottom surface thereof may be covered by the first resistor contact spacer 416B. Thus, the resistor structure 500B and the etch stop pattern 230 may be spaced apart from each other with the first resistor contact spacer 416B therebetween. Also, the second resistor contact spacer 426B and the etch stop pattern 230 may be spaced apart from each other with the first resistor contact spacer 416B therebetween.

In the semiconductor device 100 according to an example embodiment of the inventive concepts, a level of the top end of the second transistor contact spacer 426A is lower than that of the top end of the first transistor contact spacer 416A, a horizontal cross-sectional area of a top portion of an inner space defined by the transistor contact spacer 400A may be relatively greater than that of a bottom portion thereof. Thus, a horizontal cross-section of the top portion of the transistor contact structure 500A formed in the inner space defined by the transistor contact spacer 400A may be relatively greater than that of the bottom portion thereof. The top portion of the transistor contact structure 500A may function as a landing pad for a component such as a via plug disposed on a transistor contact structure. Thus, a contact area between the via plug and the transistor contact structure 500A may increase, and thus contact resistance between the via plug and the transistor contact structure 500A may be reduced.

Also, in the semiconductor device 100 according to an example embodiment of the inventive concepts, a level of the top end of the second resistor contact spacer 426B is lower than that of the top end of the first resistor contact spacer 416B, a horizontal cross-sectional area of a top portion of an inner space defined by the resistor contact spacer 400B may be relatively greater than that of a bottom portion thereof. Thus, a horizontal cross-sectional area of the top portion of the resistor contact structure 500B formed in the inner space defined by the resistor contact spacer 400B may be relatively greater than that of the bottom portion thereof. The top portion of the resistor contact structure 500B may function as a landing pad for a component such as a via plug disposed on a resistor contact structure. Thus, a contact area between the via plug and the resistor contact structure 500B may increase, and thus contact resistance between the via plug and the resistor contact structure 500B may be reduced.

Also, during an etching process for making the top end of the second resistor contact spacer 426B have a lower level than that of the top end of the first resistor contact spacer 416B, the etch stop pattern 230 may not be exposed by being covered by the first resistor contact spacer 416B, thereby reducing a probability of (or, alternatively, preventing) a portion of the etch stop pattern 230 from being etched and removed. If the portion of the etch stop pattern 230 is removed, the cross-sectional area of the resistor contact structure 500B may increase, and thus a resistance value of a resistor device configured by the resistor contact structure 500B and the resistor layer 220 electrically connected to the resistor contact structure 500B may be different from a desired target value.

However, the semiconductor device 100 according to an example embodiment of the present inventive concepts may reduce a probability of (or, alternatively, prevent) the portion of the etch stop pattern 230 from being removed, and thus the resistance value of a resistor device and a characteristic of the semiconductor device 100 may meet the desired target value.

FIGS. 2A through 2D are enlarged cross-sectional views of a portion of a semiconductor device according to an example embodiment. Specifically, FIGS. 2A through 2D are enlarged cross-sectional views of a portion A of FIG. 1, and thus redundancies between FIGS. 2A through 2D and FIG. 1 may be omitted.

Figure 2A:
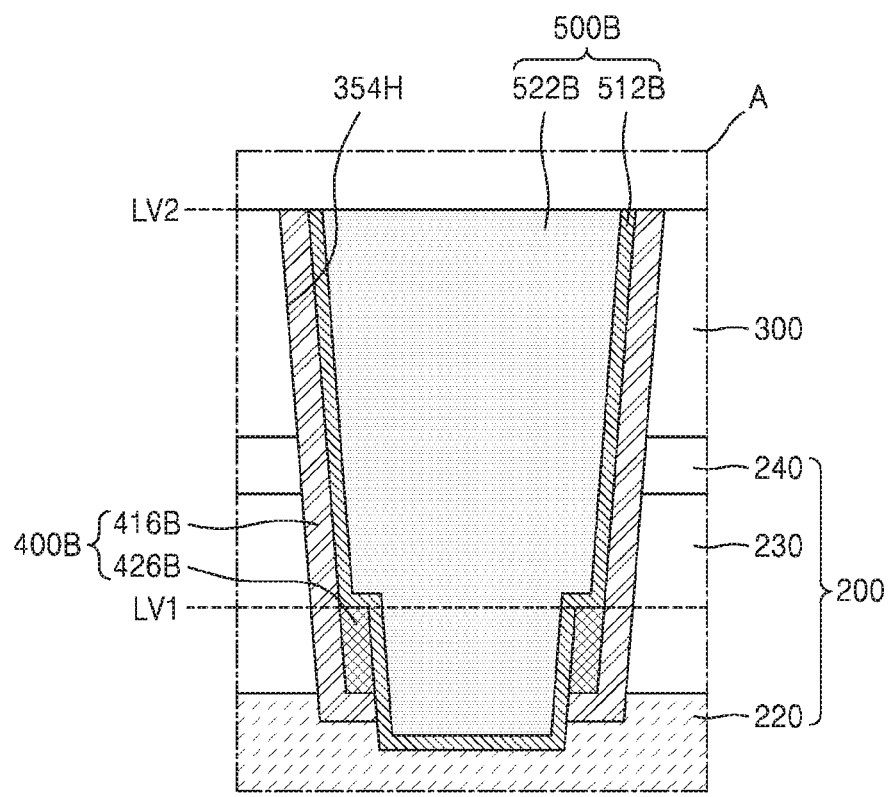
FIGS. 2A through 2D are enlarged cross-sectional views of a portion of a semiconductor device according to an example embodiment.

Referring to FIGS. 1 and 2A, the first resistor contact spacer 416B may extend with a substantially same thickness to a top side along side walls of the second resistor contact spacer 426B. In this regard, the thickness of the first resistor contact spacer 416B means a thickness of the first resistor contact spacer 416B covering an inner wall of the resistor contact hole 354H. Specifically, the first resistor contact spacer 416B may include a first portion covering a bottom end of the second resistor contact spacer 426B and a second portion extending from the first portion of the second resistor contact spacer 426B along side walls of the second contact spacer 426B to a top side farther than a top end of the second resistor contact spacer 426B. The second portion of the first resistor contact spacer 416B may extend with a substantially same thickness along one direction. The second portion of the first resistor contact spacer 416B may extend with a substantially same thickness along a direction forming an angle from about 80 degrees to about 90 degrees with respect to a main surface of the substrate 110. In some example embodiments, the top end of the first resistor contact spacer 416B and/or the top end of the second resistor contact spacer 426B may have a flat end portion with respect to the main surface of the substrate 110.

Figure 2B:
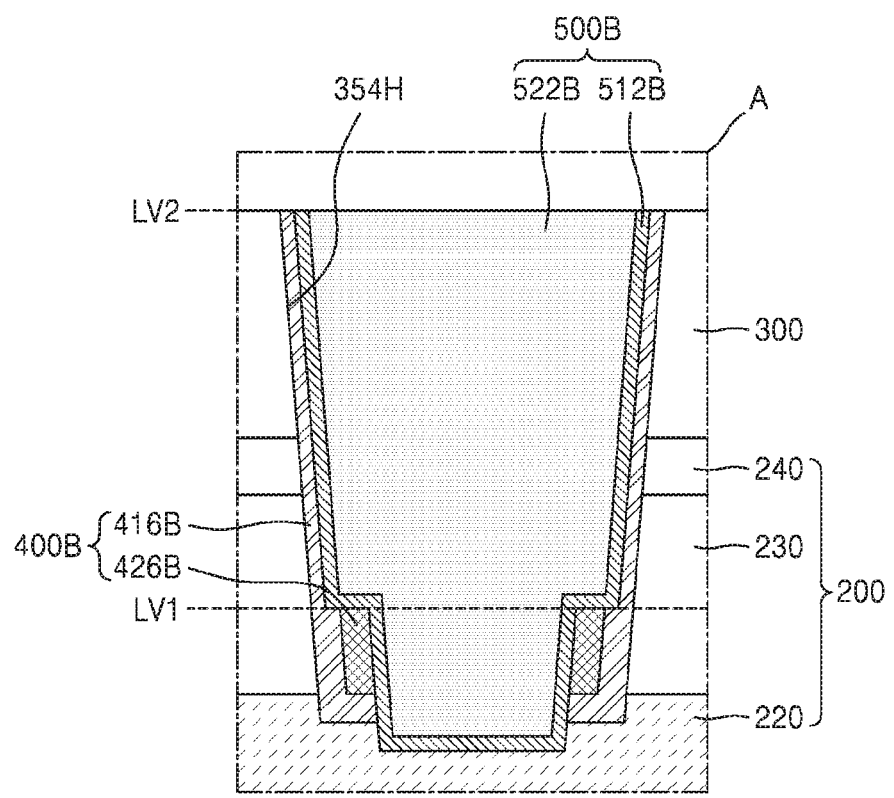

Referring to FIGS. 1 and 2B, the first resistor contact spacer 416B may extend to a top side along side walls of the second resistor contact spacer 426B and may have a variable thickness. Specifically, a upper portion of the first resistor contact spacer 416B higher than a top end of the second resistor contact spacer 426B may have smaller thicknesses than a lower portion of the first resistor contact spacer 416B lower than the top end of the second resistor contact spacer 426B, i.e. a portion covering side walls of the second resistor contact spacer 426B. For example, a portion of the first resistor contact spacer 416B higher than the first level LV1 may have a smaller thickness than that of a portion thereof lower than the first level LV1. In some example embodiments, the top end of the first resistor contact spacer 416B and/or the top end of the second resistor contact spacer 426B may have a flat end portion with respect to a main surface of the substrate 110.

Figure 2C:
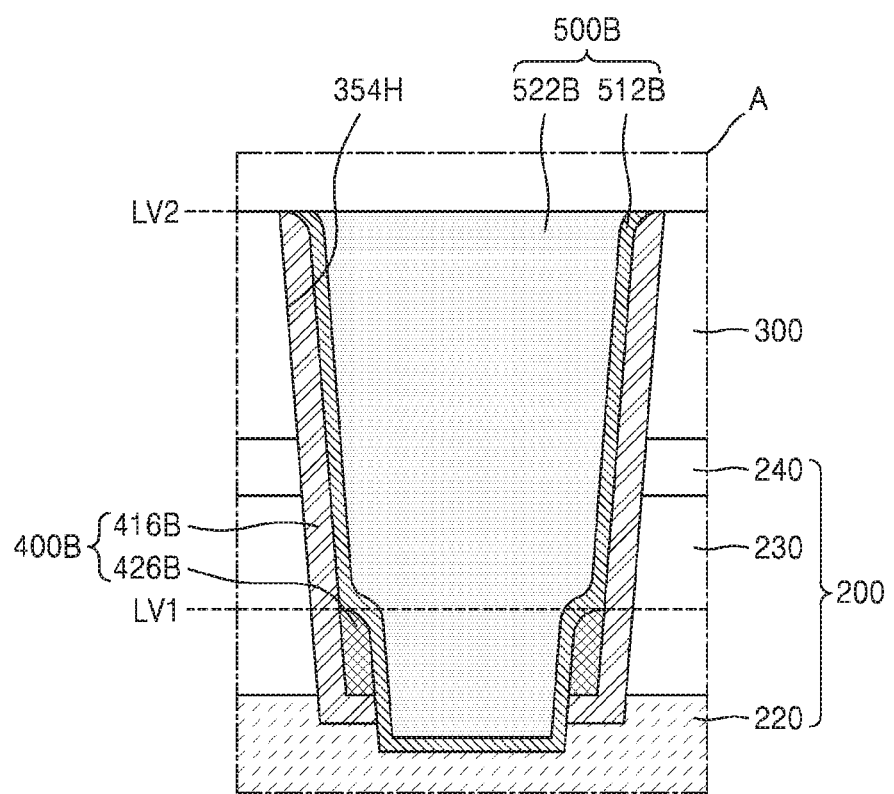

Referring to FIGS. 1 and 2C, the first resistor contact spacer 416B may extend with a substantially same thickness to a top side along side walls of the second resistor contact spacer 426B. In some example embodiments, the top end of the first resistor contact spacer 416B and/or the top end of the second resistor contact spacer 426B may be inclined with respect to the main surface of the substrate 110. For example, a portion of the resistor contact structure 500B covering each of the top end of the first resistor contact spacer 416B and/or the top end of the second resistor contact spacer 426B may be inclined with respect to the main surface of the substrate 110 or may have a rounded shape.

Figure 2D:
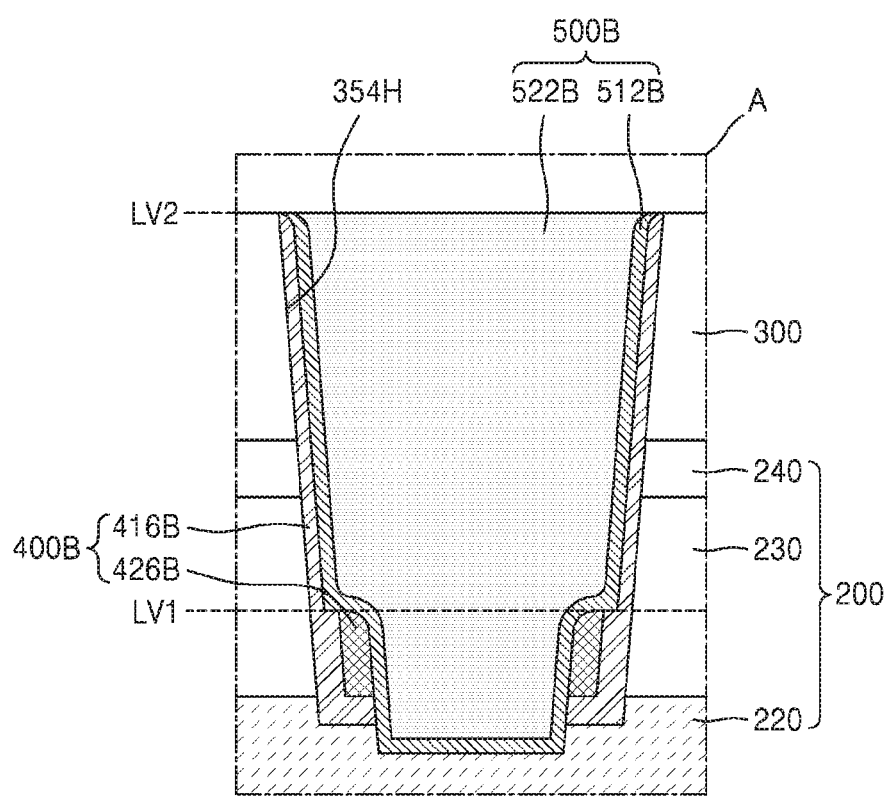

Referring to FIGS. 1 and 2D, the first resistor contact spacer 416B may extend to a top side along side walls of the second resistor contact spacer 426B and may have a variable thickness. For example, a portion of the first resistor contact spacer 416B higher than the first level LV1 may have a smaller thickness than that of a portion thereof lower than the first level LV1. In some example embodiments, the top end of the first resistor contact spacer 416B and/or the top end of the second resistor contact spacer 426B may be inclined with respect to a main surface of the substrate 110. For example, a portion of the resistor contact structure 500B covering each of the top end of the first resistor contact spacer 416B and/or the top end of the second resistor contact spacer 426B may be inclined with respect to the main surface of the substrate 110 or may have a rounded shape.

Although a shape of the resistor contact spacer 400B is respectively described with reference to FIGS. 2A through 2D, a shape of the transistor contact spacer 400A may also have a similar shape to the shape of the resistor contact spacer 400B described with reference to FIGS. 2A through 2D. For example, the first transistor contact spacer 416A may extend with a substantially same thickness to a top side along side walls of the second transistor contact spacer 426A. Alternatively, a portion of the first transistor contact spacer 416A higher than the first level LV1 may have a smaller thickness than that of a portion thereof lower than the first level LV1. For example, the top end of the first transistor contact spacer 416A and/or the top end of the second transistor contact spacer 426A may have a flat end portion with respect to a main surface of the substrate 110. Alternatively, a portion of the transistor contact structure 500A covering each of the top end of the first transistor contact spacer 416A and/or the top end of the second transistor contact spacer 426A may be inclined with respect to the main surface of the substrate 110 or may have a rounded shape.

Figure 3:
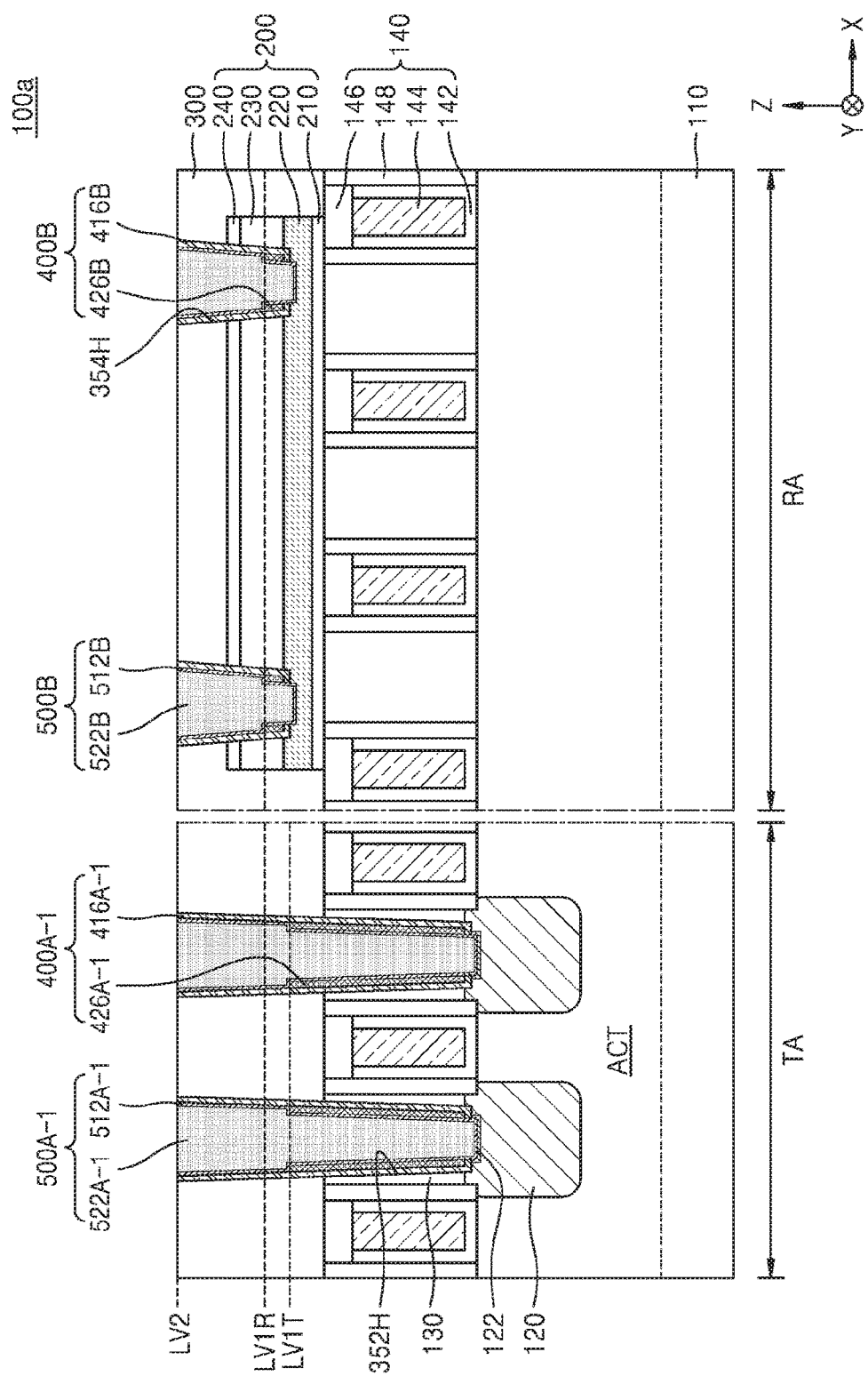
FIGS. 3 through 9 are cross-sectional views of semiconductor devices according to at least one example embodiment.

FIG. 3 is a cross-sectional view of a semiconductor device 100a according to an example embodiment. Redundant descriptions between FIGS. 1 and 3 may be omitted.

Referring to FIG. 3, the semiconductor device 100a may include the substrate 110 having the transistor area TA and the resistor area RA and including the active area ACT, a gate structure 140, a resistor structure 200, a transistor contact spacer 400A-1, a resistor contact spacer 400B, a transistor contact structure 500A-1, and a resistor contact structure 500B.

The transistor contact spacer 400A-1 may include a first transistor contact spacer 416A-1 covering an inner wall of a transistor contact hole 352H, and a second transistor contact spacer 426A-1 covering the first transistor contact spacer 416A-1. The transistor contact structure 500A-1 may include a transistor contact barrier layer 512A-1 and a transistor contact core layer 522A-1.

A top end of the second transistor contact spacer 426A-1 may be located at a first transistor level LV1T. A top end of the first transistor contact spacer 416A-1 may be located at the second level LV2 that is a higher level than the first transistor level LV1T. A top end of the second resistor contact spacer 426B may be located at a first resistor level LV1R. A top end of the first resistor contact spacer 416B may be located at the second level LV2 that is a higher level than the first resistor level LV1R.

A height between the first transistor level LV1T and the second level LV2 in the transistor area TA and a height between the first resistor transistor level LV1R and the second level LV2 in the resistor area RA may have different values. That is, a height from the top end of the second transistor contact spacer 426A-1 to the top end of the first transistor contact spacer 416A-1 and a height from the top end of the second resistor contact spacer 426B to the top end of the first resistor contact spacer 416B may have different values.

In some example embodiments, the height from the top end of the second transistor contact spacer 426A-1 to the top end of the first transistor contact spacer 416A-1 may have a greater value than the height from the top end of the second resistor contact spacer 426B to the top end of the first resistor contact spacer 416B.

In some example embodiments, the first resistor level LV1R may be higher than the first transistor level LV1T along a perpendicular direction (Z direction) from a main surface of the substrate 110.

In FIG. 3, a top surface of the upper interlayer insulating layer 300 is flat in the transistor area TA and the resistor area RA and is at the second level LV2, and the first transistor level LV1T in the transistor area TA and the first resistor level LV1R in the resistor area RA have different levels, but this is merely an example and is not limited thereto. The top surface of the upper interlayer insulating layer 300 may be changed in various ways according to a processing deviation or a pattern density between the transistor TA and the resistor area RA.

In some example embodiments, the top surface of the upper interlayer insulating layer 300 may have different levels in the transistor area TA and the resistor area RA, and the top end of the second transistor contact spacer 426A-1 and the top end of the second resistor contact spacer 426B may be at the same level. Alternatively, in some example embodiments, the top surface of the upper interlayer insulating layer 300 may have different levels in the transistor area TA and the resistor area RA, and the top end of the second transistor contact spacer 426A-1 and the top end of the second resistor contact spacer 426B may also have different levels.

Figure 4:
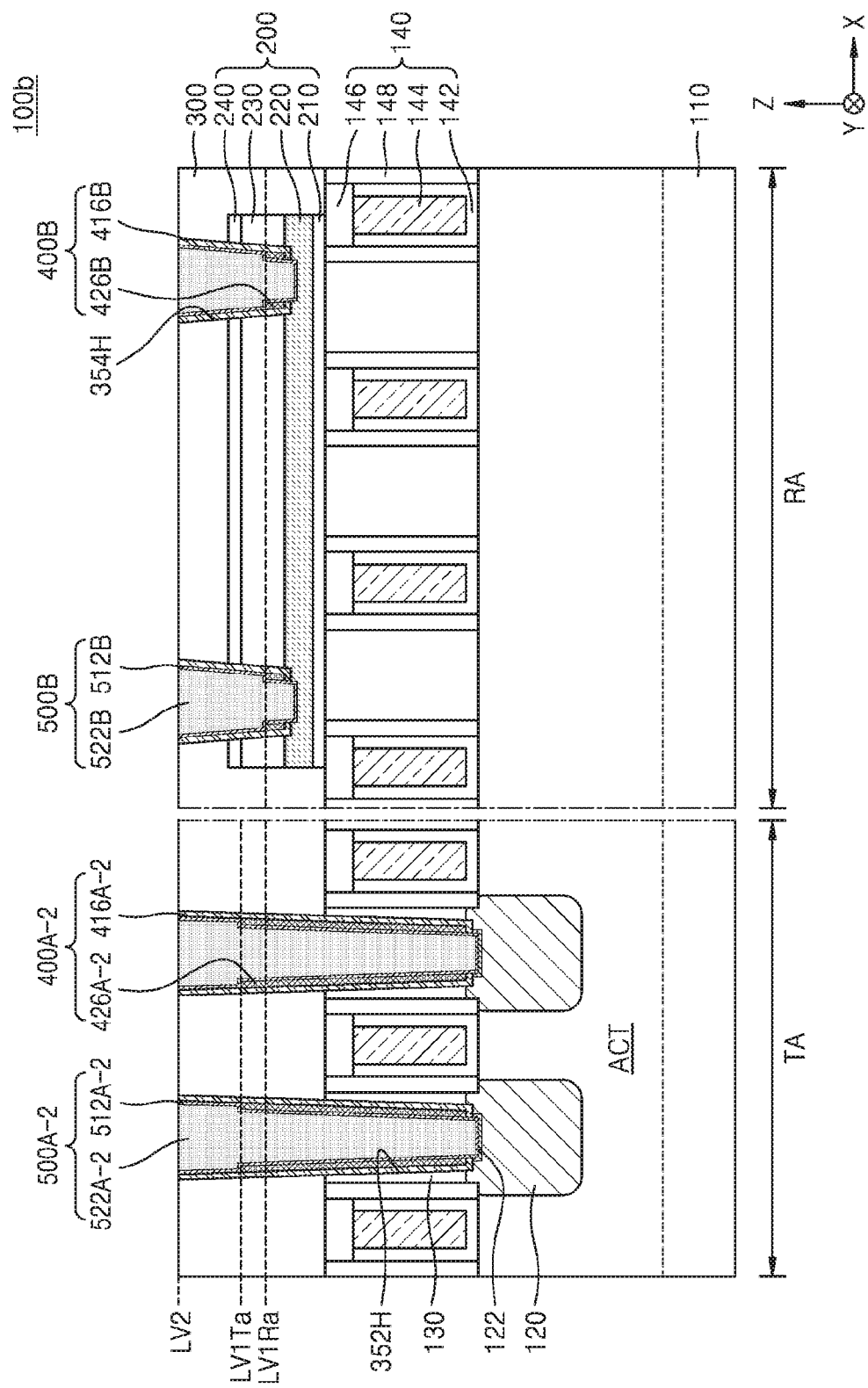

FIG. 4 is a cross-sectional view of a semiconductor device 100b according to an example embodiment. Redundant descriptions between FIGS. 1 and 4 or FIGS. 3 and 4 may be omitted.

Referring to FIG. 4, the semiconductor device 100b may include the substrate 110 having the transistor area TA and the resistor area RA and including the active area ACT, the gate structure 140, the resistor structure 200, a transistor contact spacer 400A-2, the resistor contact spacer 400B, a transistor contact structure 500A-2, and the resistor contact structure 500B.

The transistor contact spacer 400A-2 may include a first transistor contact spacer 416A-2 covering an inner wall of the transistor contact hole 352H and a second transistor contact spacer 426A-2 covering the first transistor contact spacer 416A-2. The transistor contact structure 500A-2 may include a transistor contact barrier layer 512A-2 and a transistor contact core layer 522A-2.

A top end of the second transistor contact spacer 426A-2 may be located at a first transistor level LV1Ta. A top end of the first transistor contact spacer 416A-2 may be located at the second level LV2 that is a higher level than the first transistor level LV1Ta. A top end of the second resistor contact spacer 426B may be located at a first resistor level LV1Ra. A top end of the first resistor contact spacer 416B may be located at the second level LV2 that is a higher level than the first resistor level LV1Ra.

A height from the top end of the second transistor contact spacer 426A-2 to the top end of the first transistor contact spacer 416A-2 may have a smaller value than the height from the top end of the second resistor contact spacer 426B to the top end of the first resistor contact spacer 416B.

In some example embodiments, the first resistor level LV1Ra may be lower than the first transistor level LV1Ta along a perpendicular direction (Z direction) from a main surface of the substrate 110.

Figure 5:
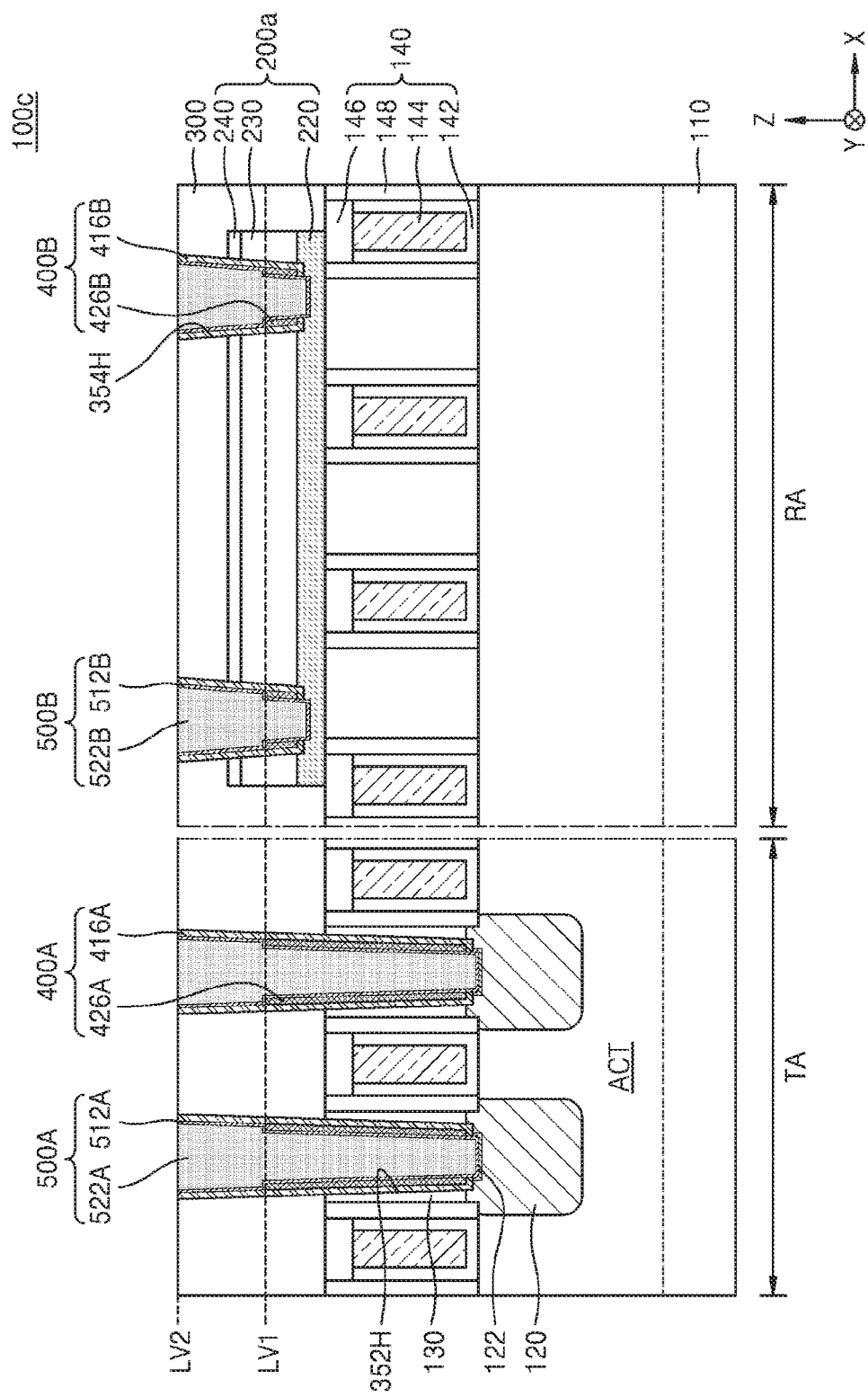

FIG. 5 is a cross-sectional view of a semiconductor device 100c according to an example embodiment. Redundant descriptions between FIGS. 1 and 5 may be omitted.

Referring to FIG. 5, the semiconductor device 100c may include the substrate 110 having the transistor area TA and the resistor area RA and including the active area ACT, the gate structure 140, a resistor structure 200a, the transistor contact spacer 400A, the resistor contact spacer 400B, the transistor contact structure 500A, and the resistor contact structure 500B.

The resistor structure 200a may include the resistor layer 220, the etch stop pattern 230, and the upper buffer insulating pattern 240. The resistor structure 200a may not include a lower buffer insulating pattern located below the resistor layer 220. Thus, the resistor layer 220 may contact the lower interlayer insulating layer 130 and the gate structure 140.

Figure 6:
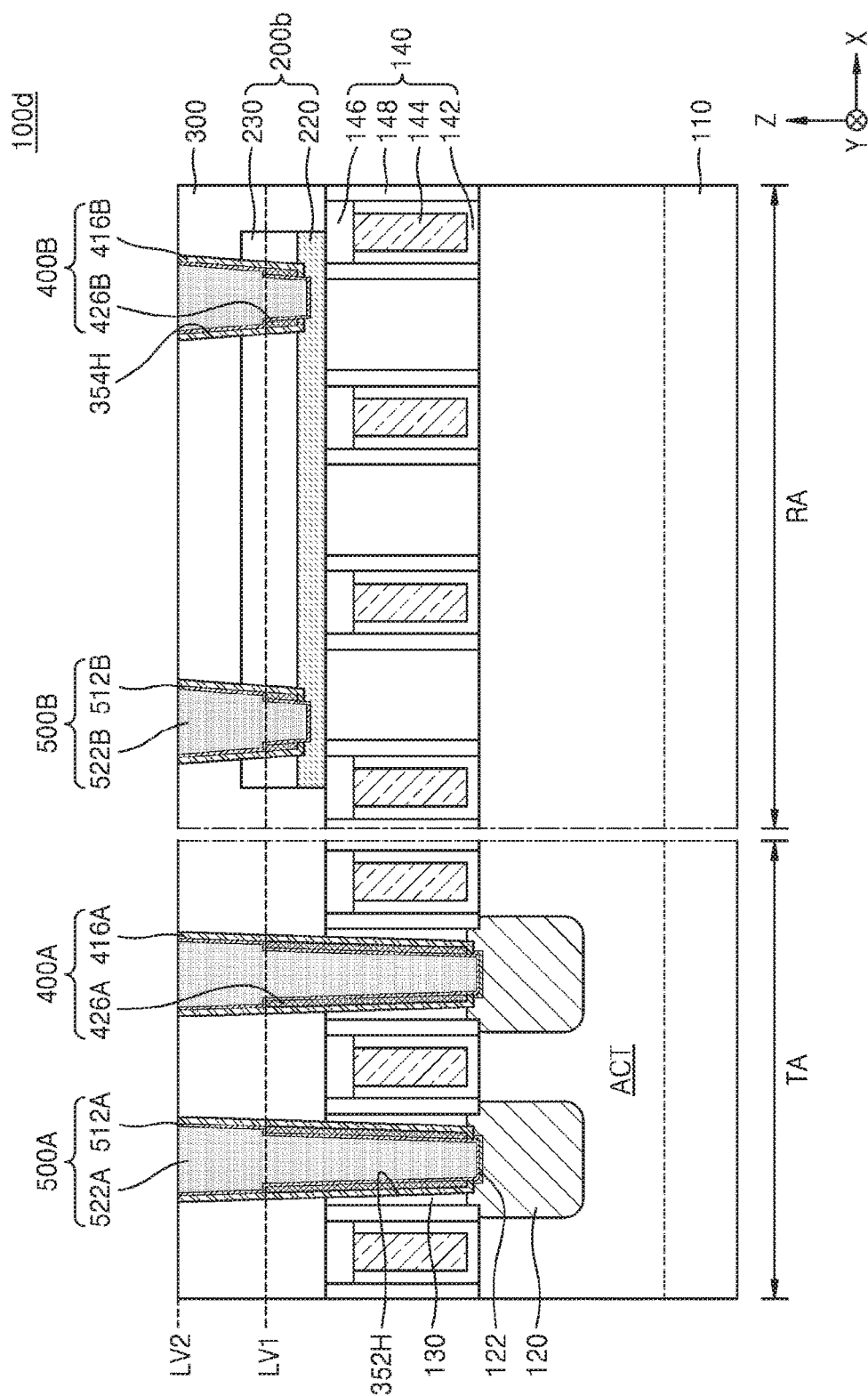

FIG. 6 is a cross-sectional view of a semiconductor device 100d according to an example embodiment. Redundant descriptions between FIGS. 1 and 6 may be omitted.

Referring to FIG. 6, the semiconductor device 100d may include the substrate 110 having the transistor area TA and the resistor area RA and including the active area ACT, the gate structure 140, a resistor structure 200b, the transistor contact spacer 400A, the resistor contact spacer 400B, the transistor contact structure 500A, and the resistor contact structure 500B.

The resistor structure 200b may include the resistor layer 220 and the etch stop pattern 230. The resistor structure 200b may not include a lower buffer insulating pattern located below the resistor layer 220 and an upper buffer insulating pattern located above the etch stop pattern 230. Thus, the resistor layer 220 may contact the lower interlayer insulating layer 130 and the gate structure 140, and the upper interlayer insulating layer 300 may contact a top surface of the etch stop pattern 230.

Figure 7:
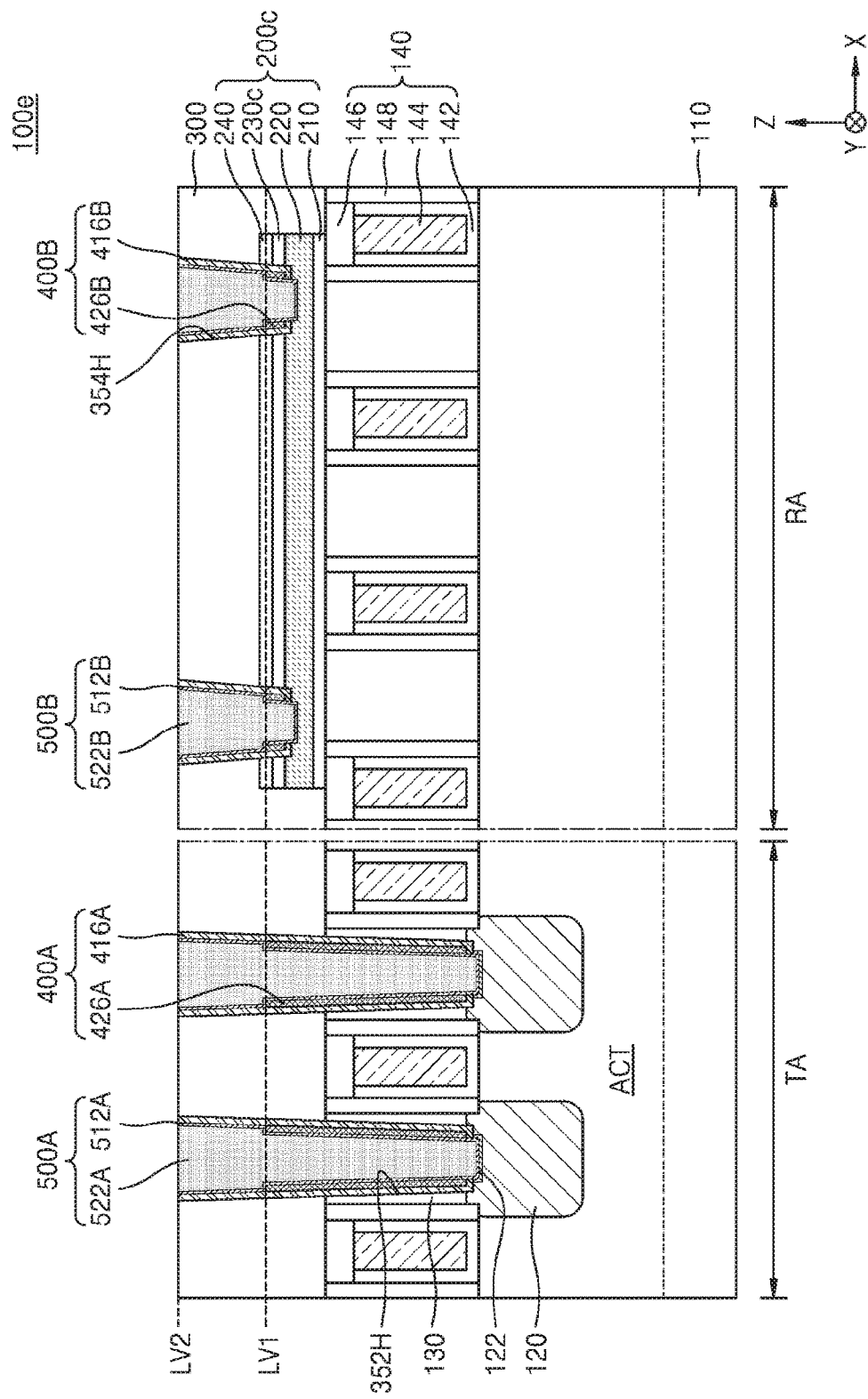

FIG. 7 is a cross-sectional view of a semiconductor device 100e according to an example embodiment. Redundant descriptions between FIGS. 1 and 7 may be omitted.

Referring to FIG. 7, the semiconductor device 100e may include the substrate 110 having the transistor area TA and the resistor area RA and including the active area ACT, the gate structure 140, a resistor structure 200c, the transistor contact spacer 400A, the resistor contact spacer 400B, the transistor contact structure 500A, and the resistor contact structure 500B.

The resistor structure 200c may include the lower buffer insulating pattern 210, the resistor layer 220, an etch stop pattern 230c, and the upper buffer insulating pattern 240. In some example embodiments, the resistor structure 200c may not include the lower buffer insulating pattern 210 and/or the upper buffer insulating pattern 240.

In some example embodiments, the etch stop pattern 230c may be thinner than the resistor layer 220. In some example embodiments, a top end of the second resistor contact spacer 426B may be located at the first level LV1 that is a level higher than a top surface of the etch stop pattern 230c.

Figure 8:
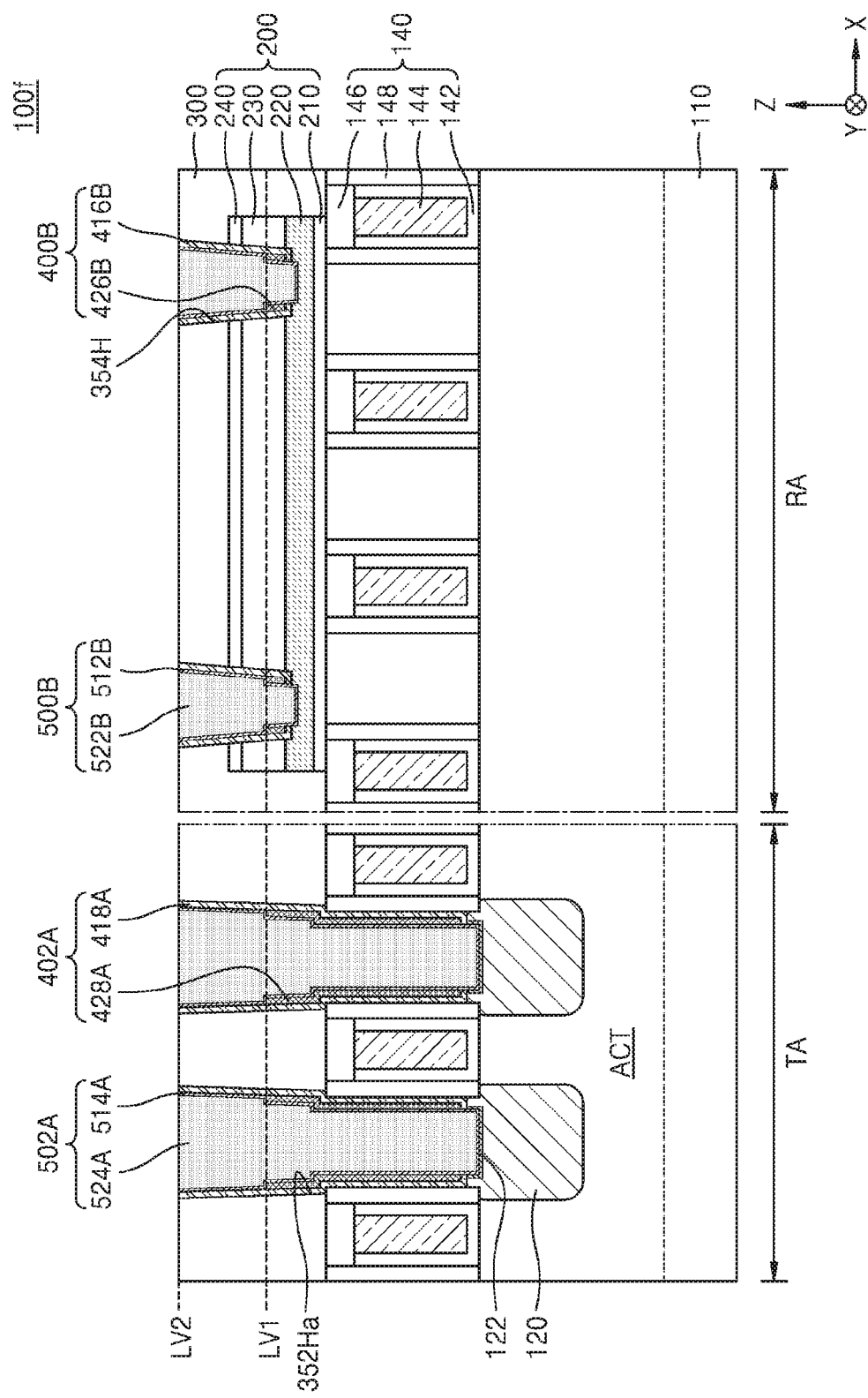

FIG. 8 is a cross-sectional view of a semiconductor device 100f according to an example embodiment. Redundant descriptions between FIGS. 1 and 8 may be omitted.

Referring to FIG. 8, the semiconductor device 100f may include the substrate 110 having the transistor area TA and the resistor area RA and including the active area ACT, the gate structure 140, the resistor structure 200, a transistor contact spacer 402A, the resistor contact spacer 400B, a transistor contact structure 502A, and the resistor contact structure 500B.

Figure 12:
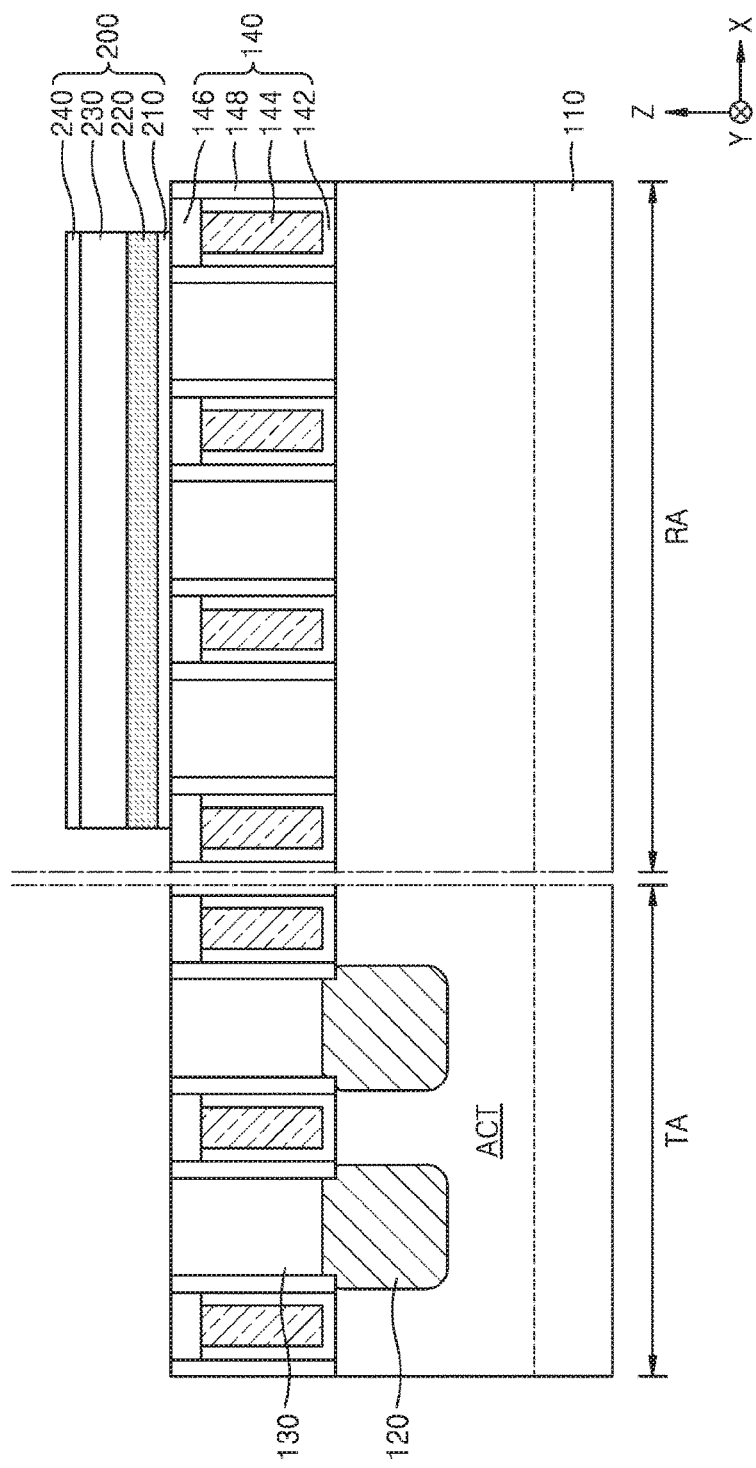

In the transistor area TA, a transistor contact hole 352Ha may be formed passing through the upper interlayer insulating layer 300 and the lower interlayer insulating layer 130 of FIG. 12 and exposing, through a bottom surface thereof, a portion of the impurity areas 120. When the transistor contact hole 352Ha is formed through a self-alignment method by using the gate spacers 148, the transistor contact hole 352Ha may be formed to expose side walls of the gate spacers 148. That is, a portion of the side walls of the gate spacers 148 may be a part of an outer wall of the transistor contact hole 352Ha.

The transistor contact spacer 402A may include a first transistor contact spacer 418A covering an inner wall of the transistor contact hole 352Ha and a second transistor contact spacer 428A covering the first transistor contact spacer 418A. The first transistor contact spacer 418A may contact the gate spacers 148.

In some example embodiments, the transistor contact spacer 402A may extend into the impurity areas 120. That is, in some example embodiments, a level of a bottom surface of the transistor contact spacer 402A may be lower than that of an uppermost surface of the impurity areas 120.

The first transistor contact spacer 418A and the first resistor contact spacer 416B may include the same material. Also, the second transistor contact spacer 428A and the second resistor contact spacer 426B may include the same material.

The transistor contact structure 502A filling the transistor contact hole 352Ha and contacting a portion of the impurity areas 120 may be formed in the transistor contact hole 352Ha. In some example embodiments, the transistor contact spacer 502A may extend into the impurity areas 120. That is, in some example embodiments, a level of a bottom surface of the transistor contact spacer 502A may be lower than that of an uppermost surface of the impurity areas 120. In some example embodiments, the transistor contact structure 502A may extend farther into the impurity areas 120 than the transistor contact spacer 402A. That is, in some example embodiments, the level of the bottom surface of the transistor contact structure 502A may be lower than that of the bottom surface of the transistor contact spacer 402A.

The transistor contact structure 502A may include a transistor contact barrier layer 514A and a transistor contact core layer 524A. The transistor contact barrier layer 514A and the resistor contact barrier layer 512B may include the same material. The transistor contact barrier layer 514A may be formed to conformally cover a top surface of the transistor contact spacer 402A covering an inner wall of the transistor contact hole 352H and a top surface of a portion of the impurity areas 120 exposed through the bottom surface of the transistor contact hole 352Ha. The transistor contact core layer 524A may be formed so as to cover a top surface of the transistor contact barrier layer 514A and fill the transistor contact hole 352Ha. Thus, the transistor contact barrier layer 514A may cover side and bottom surfaces of the transistor contact core layer 524A.

The second transistor contact spacer 428A may be disposed between the first transistor contact spacer 418A and the transistor contact structure 502A. A top end of the second transistor contact spacer 428A may be located at the first level LV1. A top end of the first transistor contact spacer 418A may be located at the second level LV2 higher than the first level LV1. That is, a level of the top end of the second transistor contact spacer 428A may be lower than that of the top end of the first transistor contact spacer 418A. The first transistor contact spacer 418A may, in a perpendicular direction (a Z direction), extend farther from a main surface of the substrate 110 than the second transistor contact spacer 428A, such that the top end of the first transistor contact spacer 418A may be located at the second level LV2 that is the same level as a top surface of the upper interlayer insulating layer 300. A top end of the second transistor contact spacer 428A may be located at the first level LV1 that is a level between the bottom and top surfaces of the upper interlayer insulating layer 300.

Thus, sides of a top portion of the transistor contact structure 502A may contact the first transistor contact spacer 418A, and sides of a bottom portion thereof may contact the second transistor contact spacer 428A. In some example embodiments, the silicide layer 122 may be disposed on the transistor contact structure 502A, i.e. between the transistor contact barrier layer 514A and the impurity areas 120.

The bottom surface of the second transistor contact spacer 428A may contact the first transistor contact spacer 418A and may be covered by the first transistor contact spacer 418A. The top surface of the second transistor contact spacer 428A may contact the transistor contact structure 502A and may be covered by the transistor contact structure 502A. An inner wall and a top surface of the second transistor contact spacer 428A may be covered by the transistor contact barrier layer 514A of the transistor contact structure 502A, and an outer wall and a bottom surface thereof may be covered by the first transistor contact spacer 418A.

The semiconductor device 100f according to an example embodiment of the inventive concepts may form the transistor contact structure 502A by using the self-alignment method, thereby relatively increasing a horizontal cross-sectional area of the transistor contact structure 502A and reducing a contact resistance.

Although not shown, the semiconductor device 100f shown in FIG. 8 may be changed like the semiconductor devices 100a, 100b, 100c, 100d, and 100e shown in FIGS. 2 through 7 with respect to the semiconductor device 100 shown in FIG. 1.

Figure 9:
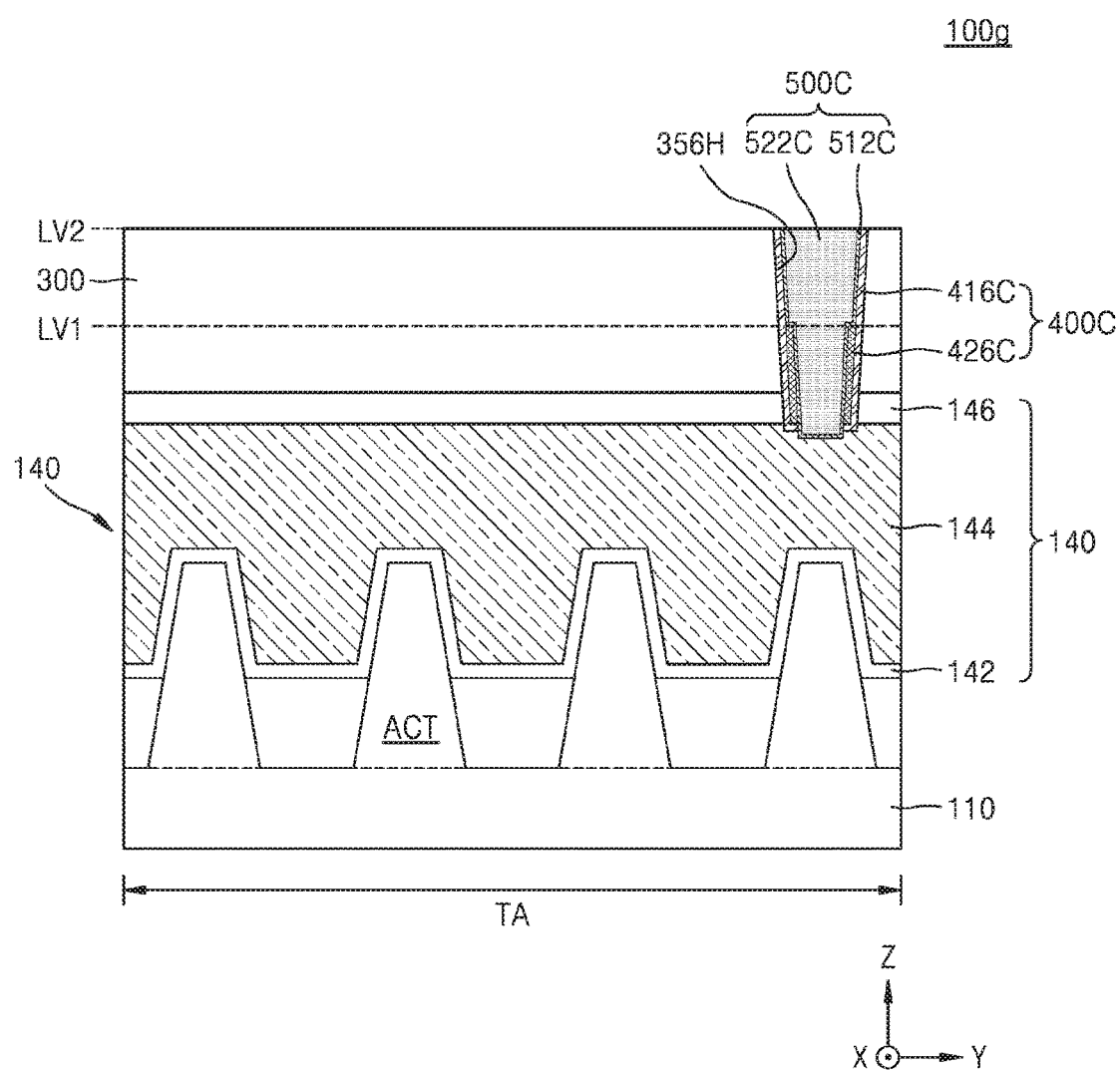

FIG. 9 is a cross-sectional view of a semiconductor device 100g according to an example embodiment. Specifically, FIG. 9 may be a cross-sectional view of the semiconductor devices 100, 100a, 100b, 100c, 100d, 100e, and 100f shown in FIGS. 1 through 8 along an extension direction (a Y direction) of the gate electrode 144, and will be described with reference to FIGS. 1 through 9 in the present specification.

Referring to FIGS. 1 and 9, the semiconductor device 100g may include the substrate 110 having the transistor area TA and the resistor area RA and including the active area ACT, the gate structure 140, the resistor structure 200, the transistor contact spacer 400A, the resistor contact spacer 400B, a gate contact spacer 400C, the transistor contact structure 500A, the resistor contact structure 500B, and a gate contact structure 500C.

The active area ACT may be a fin-type active area protruding in a direction perpendicular to a main surface of, for example, the substrate 110. A plurality of active areas ACT may be disposed so as to extend over a desired (or, alternatively, a predetermined) distance. The gate electrode 144 may cross a portion of the active area ACT so as to extend in one direction (a Y direction). An extension direction (the Y direction) of the gate electrode 144 may be orthogonal to an extension direction (an X direction) of the active area ACT. The gate electrode 144 may be formed so as to cover the gate dielectric layer 142 above a top surface and both side walls of the active area ACT.

A gate contact hole 356H passing through the upper interlayer insulating layer 300 and the gate capping layer 146 and exposing a portion of the gate electrode 144 through its bottom surface may be formed in the transistor area TA. The gate contact spacer 400C may include a first gate contact spacer 416C covering the inner wall of the transistor contact hole 356H and a second gate contact spacer 426C covering the first gate contact spacer 416C. In some example embodiments, the gate contact spacer 400C may extend into the gate electrode 144. That is, in some example embodiments, a level of a bottom surface of the gate contact spacer 400C may be lower than that of an uppermost surface of the gate electrode 144.

The first transistor contact spacer 416A, the first resistor contact spacer 416B, and the first gate contact spacer 416C may include the same material. Also, the second transistor contact spacer 426A, the second resistor contact spacer 426B, and the second gate contact spacer 426C may include the same material.

The gate contact structure 500C filling the gate contact hole 356H and contacting a portion of the gate electrode 144 may be formed in the gate contact hole 356H. In some example embodiments, the gate contact structure 500C may extend into the gate electrode 144. That is, in some example embodiments, a level of a bottom surface of the gate contact structure 500C may be lower than the of the gate contact spacer 400C.

The gate contact structure 500C may include a gate contact barrier layer 512C and a gate contact core layer 522C. The transistor contact barrier layer 512A, the resistor contact barrier layer 512B, and the gate contact barrier layer 512C may include the same material. The gate contact barrier layer 512C may be formed to conformally cover a top surface of the gate contact spacer 400C covering the inner wall of the gate contact hole 356H and a top surface of a portion of the gate electrode 144 exposed through the bottom surface of the transistor contact hole 356H. The gate contact core layer 522C may be formed to cover a top surface of the gate contact barrier layer 512C and fill the gate contact hole 356H. Thus, the gate contact barrier layer 512C may cover side and bottom surfaces of the gate contact core layer 522C.

The second gate contact spacer 426C may be disposed between the first gate contact spacer 416C and the gate contact structure 500C. A top end of the second gate contact spacer 426C may be located at the first level LV1. A top end of the first gate contact spacer 416C may be located at a second level LV2 higher than the first level LV1. That is, a level of the top end of the second gate contact spacer 426C may be lower than a level of the top end of the first gate contact spacer 416C. The first gate contact spacer 416C may, in a perpendicular direction (a Z direction), extend farther from a main surface of the substrate 110 than the second gate contact spacer 426C, such that the top end of the first gate contact spacer 416C may be located at the second level LV2 that is the same level as a top surface of the upper interlayer insulating layer 300. A top end of the second gate contact spacer 426C may be located at the first level LV1 that is a level between the bottom and top surfaces of the upper interlayer insulating layer 300. Thus, sides of a top portion of the gate contact structure 500C may contact the first gate contact spacer 416C, and sides of a bottom portion thereof may contact the second gate contact spacer 426C.

The bottom surface of the second gate contact spacer 426C may contact the first gate contact spacer 416C and may be covered by the first gate contact spacer 416C. The top surface of the second gate contact spacer 426C may contact the gate contact structure 500C and may be covered by the gate contact structure 500C. An inner wall and a top surface of the second gate contact spacer 426C may be covered by the gate contact barrier layer 512C of the gate contact structure 500C, and an outer wall and a bottom surface thereof may be covered by the first gate contact spacer 416C.

The top ends of the second transistor contact spacer 426A, the second resistor contact spacer 426B, and the second gate contact spacer 426C may be located at the first level LV1, and the top ends of the first transistor contact spacer 416A, the first resistor contact spacer 416B, and the first gate contact spacer 416C may be located at the second level LV2.

Although not shown, a change in a shape of the resistor contact spacer 400B shown in FIGS. 2A through 2D may be applied to the transistor contact spacers 400A, 400A-1, 400A-2, and 402A, the resistor contact spacer 400B, and/or the gate contact spacer 400C of the semiconductor devices 100a, 100b, 100c, 100d, 100e, 100f, and 100g of FIGS. 3 through 9.

FIGS. 10 through 19 are cross-sectional views for describing a method of manufacturing a semiconductor device, according to an example embodiment. FIGS. 10 through 19 are cross-sectional views for describing a method of manufacturing the semiconductor device 100, and thus methods of manufacturing the semiconductor devices 100a, 100b, 100c, 100d, 100e, 100f, and 100g of FIGS. 3 through 9 will be additionally described.

Figure 10:
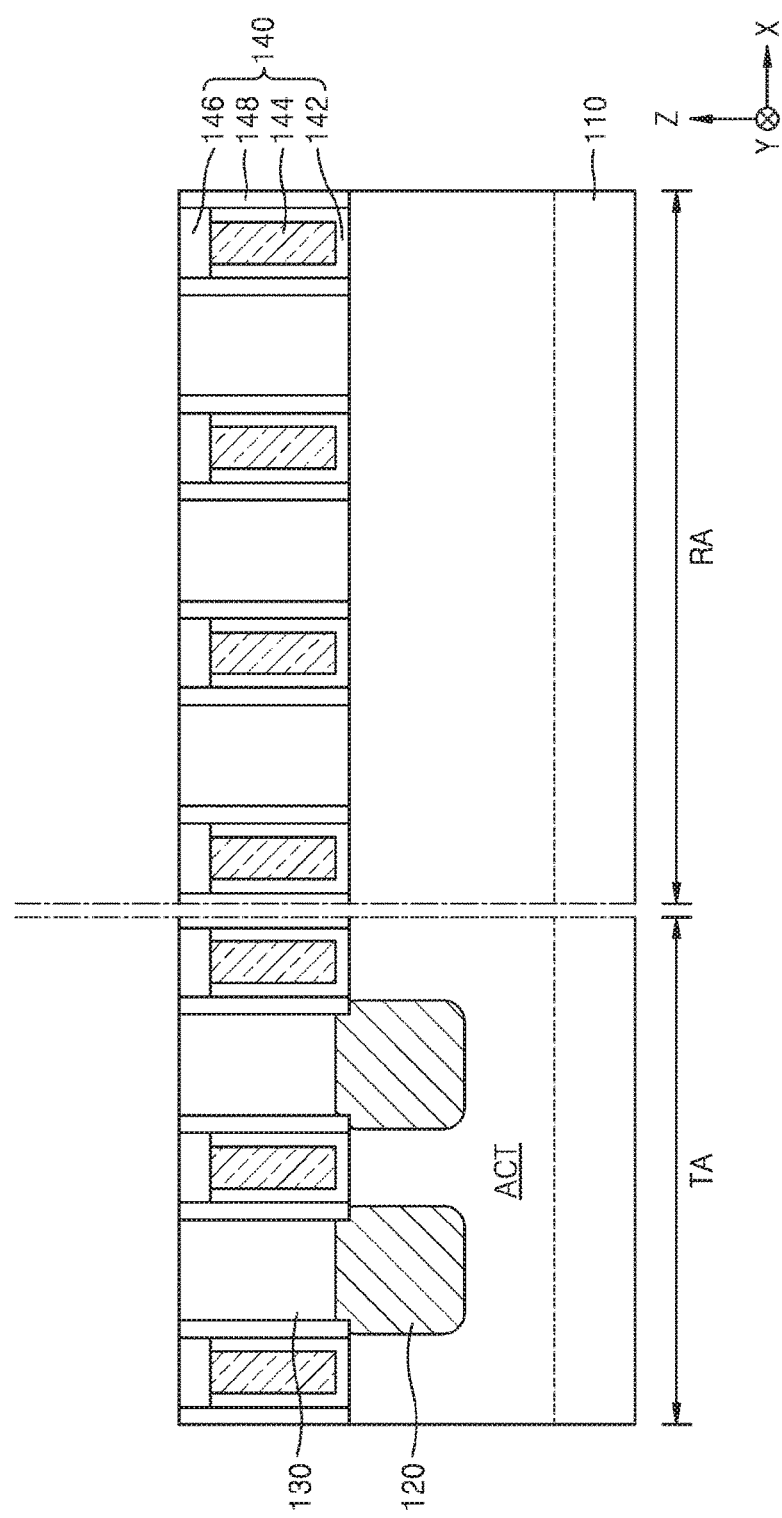
FIGS. 10 through 19 are cross-sectional views for describing a method of manufacturing a semiconductor device, according to an example embodiment.

Referring to FIG. 10, the gate structure 140 in which the gate dielectric layer 142, the gate electrode 144, and the gate capping layer 146 are disposed between the pair of gate spacers 148 may be formed on the substrate 110 including the transistor area TA and the resistor area RA.

In the transistor area TA, the impurity areas 120 may be formed between the gate structures 140 by injecting ions. In some example embodiments, the impurity areas 120 may be formed by removing a portion of the substrate 110 between the gate structures 140, forming a recessed area, and growing an epitaxial layer including impurities in the recessed area.

In some example embodiments, the gate structure 140 may be formed by using a replacement gate method. For example, the gate structure 140 may be formed by forming the pair of gate spacers 148 covering side walls of a sacrificial dielectric pattern and a sacrificial electrode pattern, removing the sacrificial dielectric pattern and the sacrificial electrode pattern, and forming the gate dielectric layer 142, the gate electrode 144, and the gate capping layer 146 filling a space between the pair of gate spacers 148.

Figure 11:
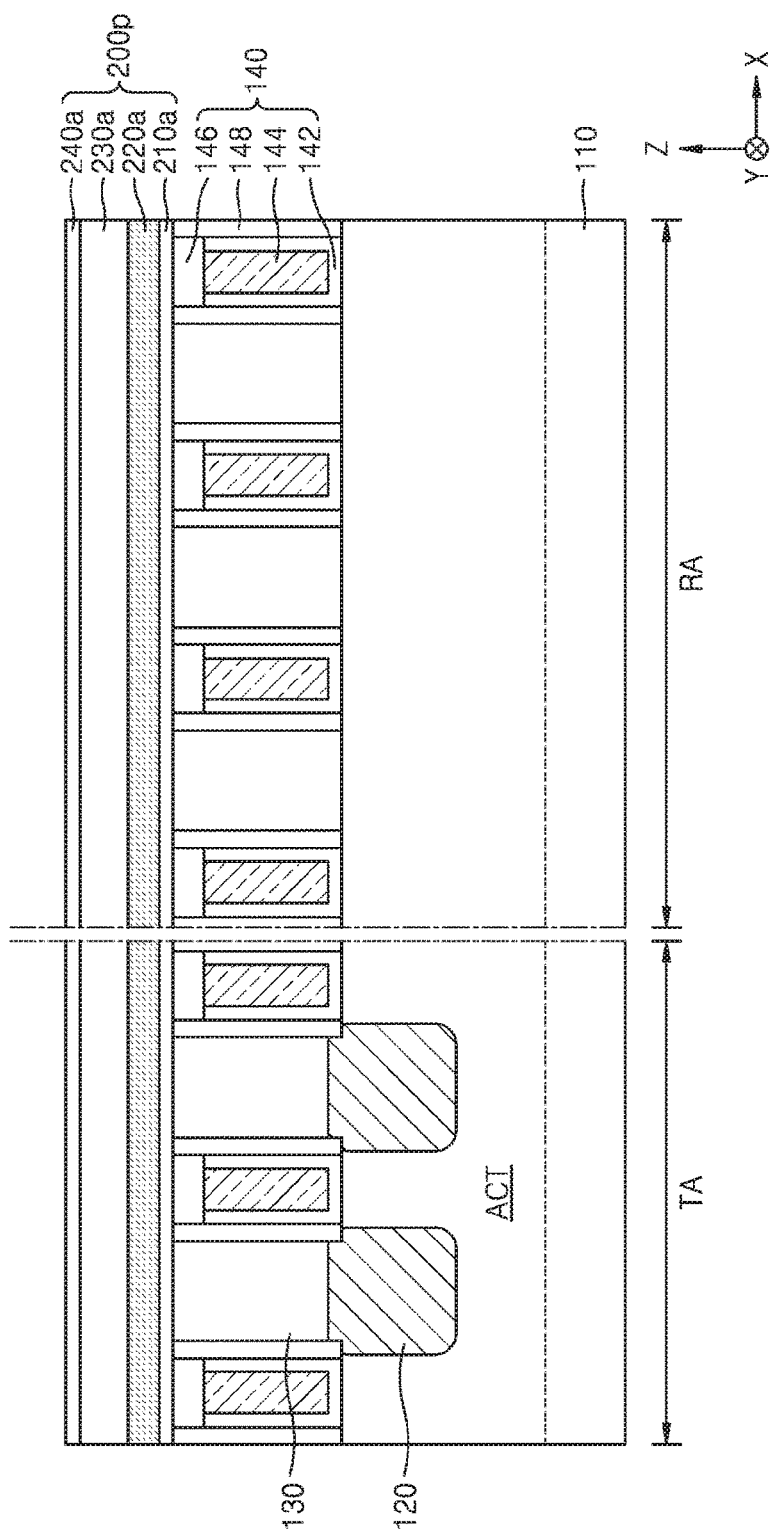

Referring to FIG. 11, a preliminary resistor structure 200*p* may be formed on the lower interlayer insulating layer 130 and the gate structure 140. The preliminary resistor structure 200*p* may include the lower preliminary buffer insulating pattern 210*a*, a preliminary resistor layer 220*a*, a preliminary etch stop pattern 230*a*, and an upper preliminary buffer insulating pattern 240*a*.

In some example embodiments, when the lower preliminary buffer insulating pattern 210*a* is not formed, the semiconductor device 100*c* of FIG. 5 may be formed. In some example embodiments, when the lower preliminary buffer insulating pattern 210*a* and the upper preliminary buffer insulating pattern 240*a* are not formed, the semiconductor device 100*d* of FIG. 6 may be formed. In some example embodiments, when the preliminary etch stop pattern 230*a* is thinner than the preliminary resistor layer 220*a*, the semiconductor device 100*e* of FIG. 7 may be formed.

Referring to FIGS. 11 and 12, the resistor structure 200 may be formed by patterning the preliminary resistor structure 200*p*. To form the resistor structure 200, a portion of the preliminary resistor structure 200*p* formed in the transistor area TA may be wholly removed. In some example embodiments, to form the resistor structure 200, a portion of the preliminary resistor structure 200*p* formed in the resistor area RA may be removed.

Figure 13:
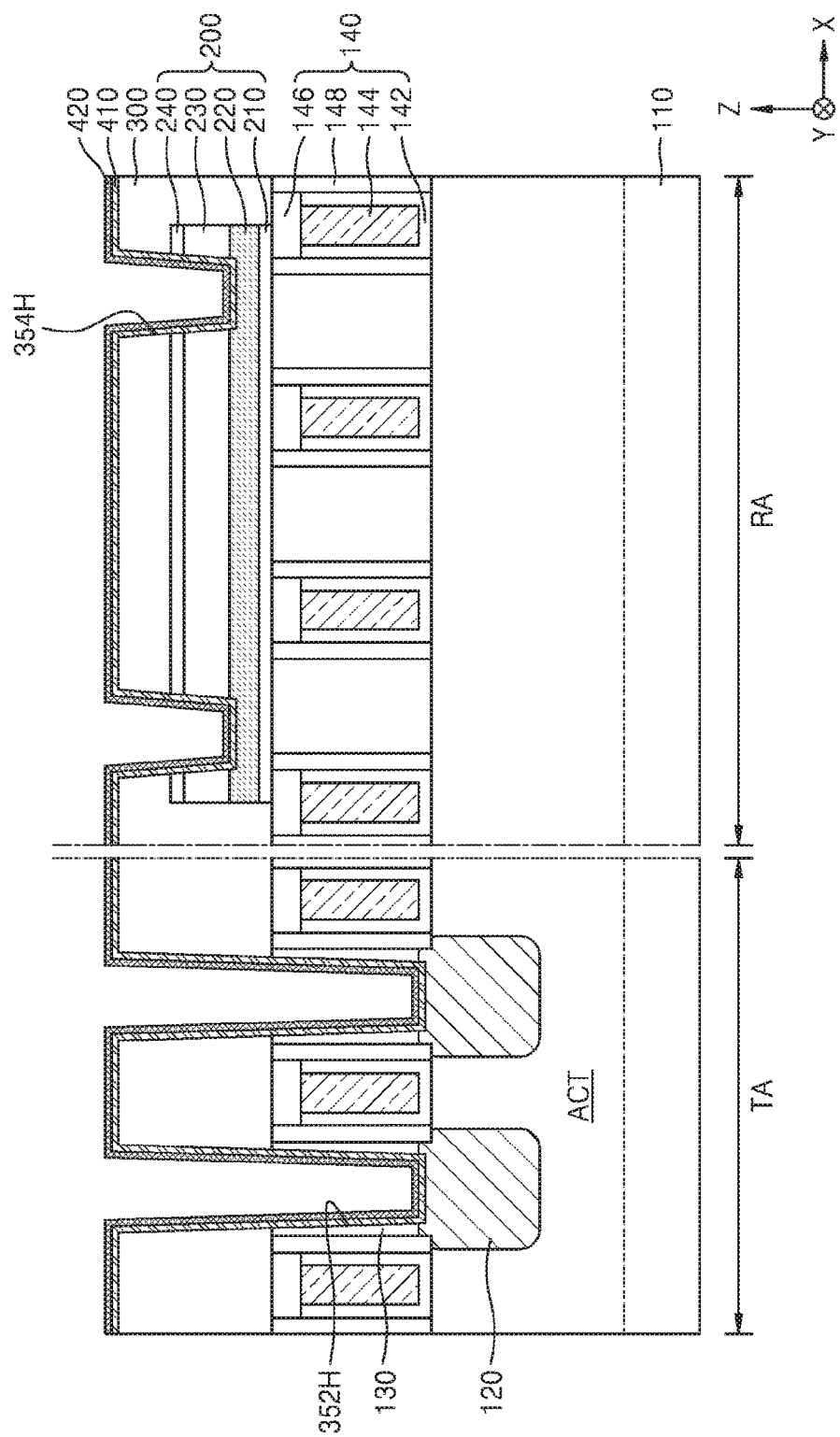

Referring to FIG. 13, the upper interlayer insulating layer 300 covering the resistor structure 200 may be formed on the substrate 110. The upper interlayer insulating layer 300 may be formed in both the transistor area TA and the resistor area RA.

Thereafter, the transistor contact hole 352H passing through the upper interlayer insulating layer 300 and the lower interlayer insulating layer 130 and exposing a portion of the impurity areas 120 through a bottom surface may be formed in the transistor area TA. Also, the resistor contact hole 354H passing through the upper interlayer insulating layer 300, the upper buffer insulating pattern 240, and the etch stop pattern 230 and exposing a portion of the resistor layer 220 through a bottom surface may be formed in the resistor area RA. The transistor contact hole 352H and the resistor contact hole 354H may be simultaneously formed in-situ through an etching process or may be individually formed through separate etching processes. The transistor contact hole 352H and the resistor contact hole 354H may respectively extend into the impurity areas 120 and the resistor layer 220.

In some example embodiments, when the gate contact hole 356H (FIG. 9) passing through the upper interlayer insulating layer 300 and the gate capping layer 146 and exposing a portion of the gate electrode 144 through a bottom surface is formed in the transistor area TA, the semiconductor device 100*g* of FIG. 9 may be formed.

After the transistor contact hole 352H and the resistor contact hole 354H are formed, a first preliminary spacer layer 410 and a second preliminary spacer layer 420 covering an inner surface of the transistor contact hole 352H, an inner surface of the resistor contact hole 354H, and a top surface of the upper interlayer insulating layer 300 may be sequentially formed. The first preliminary spacer layer 410 and the second preliminary spacer layer 420 may be conformally formed on the inner surface of the transistor contact hole 352H, the inner surface of the resistor contact hole 354H, and the top surface of the upper interlayer insulating layer 300.

Figure 14:
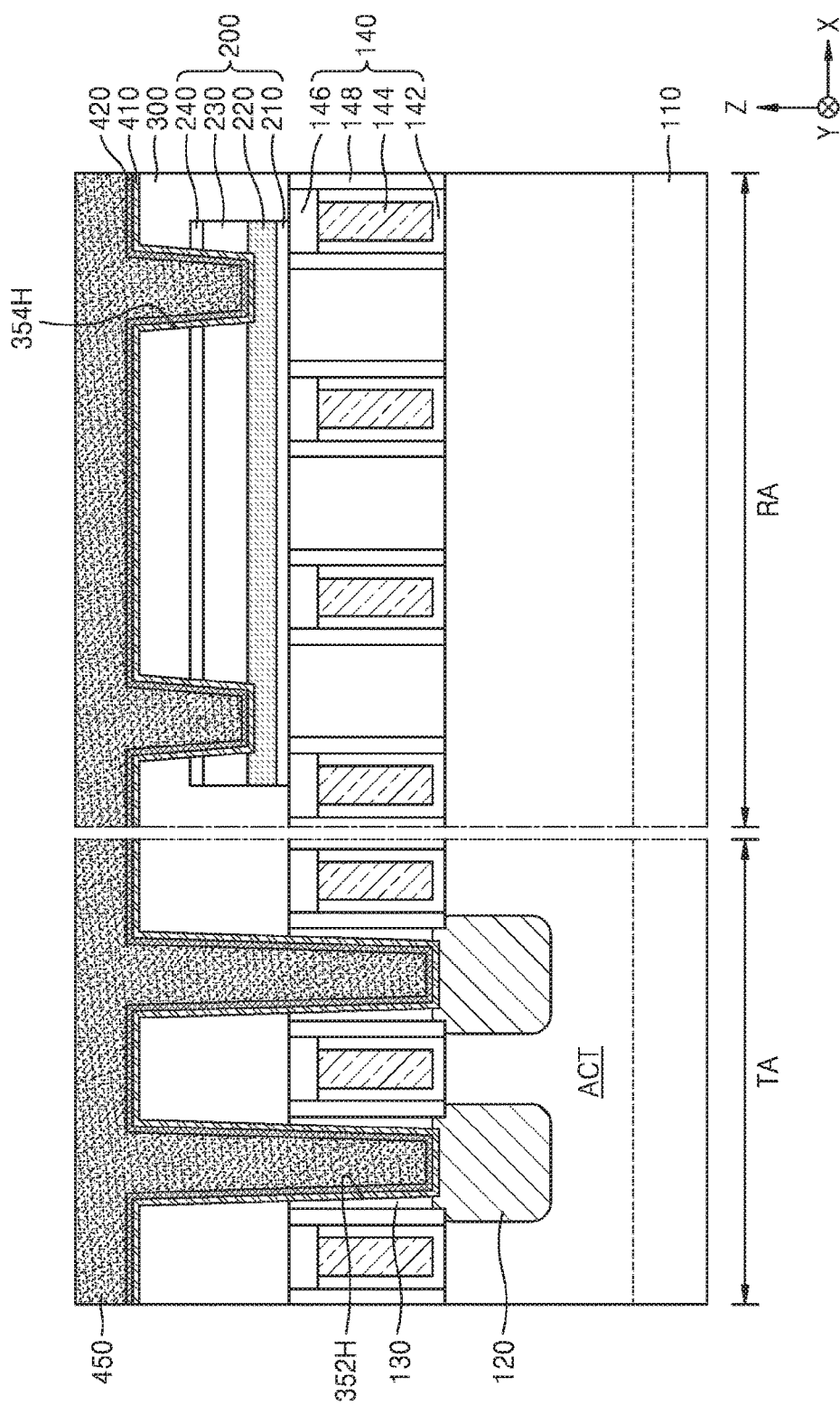

Referring to FIG. 14, a cover mold layer 450 filling both the transistor contact hole 352H and the resistor contact hole 354H may be formed on the first preliminary spacer layer 410 and the second preliminary spacer layer 420. The cover mold layer 450 may include, for example, an amorphous carbon layer (ACL) or a spin-on hardmask (SOH).

Figure 15:
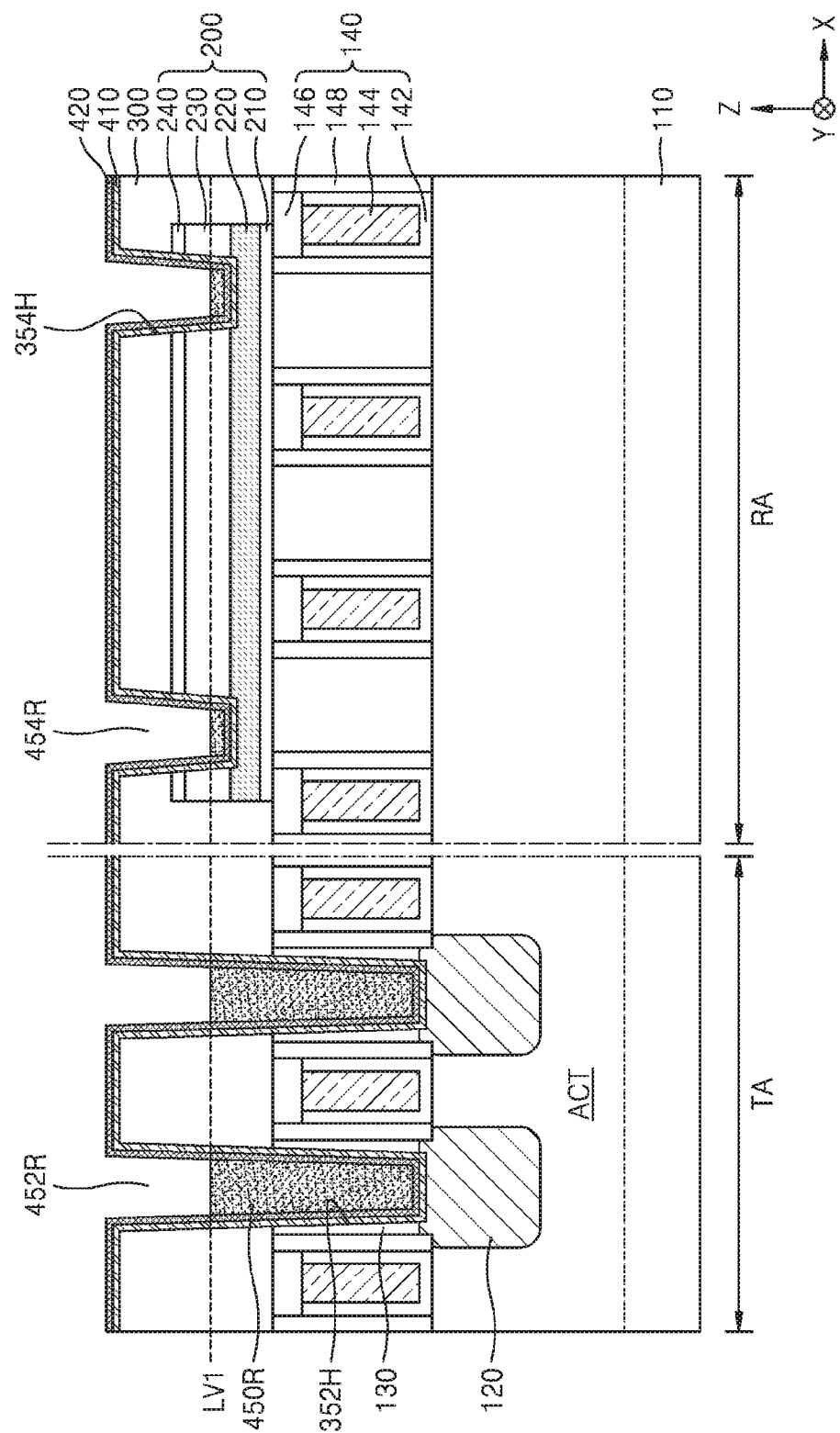

Referring to FIGS. 14 and 15, a mold layer 450R may be formed by removing a portion of the cover mold layer 450. A portion of the second preliminary spacer layer 420 of the mold layer 450R may be covered while a remaining portion thereof may be exposed. The mold layer 450R may be formed by removing a portion of the cover mold layer 450 such that a top surface of the mold layer 450R is located at the first level LV1. The top surface of the mold layer 450R may be located at the first level LV1 that is a level between top and bottom surfaces of the etch stop pattern 230 in the resistor area RA.

In some example embodiments, when the first level LV1 has a different level (the first transistor levels LV1T and LV1Ta of FIGS. 3 and 4) and there are first resistor levels LV1R and LV1Ra in the transistor area TA and the resistor area RA according to a processing deviation or a pattern density, or a top surface of the upper interlayer insulating layer 300 has a different level in each of the transistor area TA and the resistor area RA, the semiconductor devices 100*a* and 100*b* of FIGS. 3 and 4 may be formed.

Figure 16:
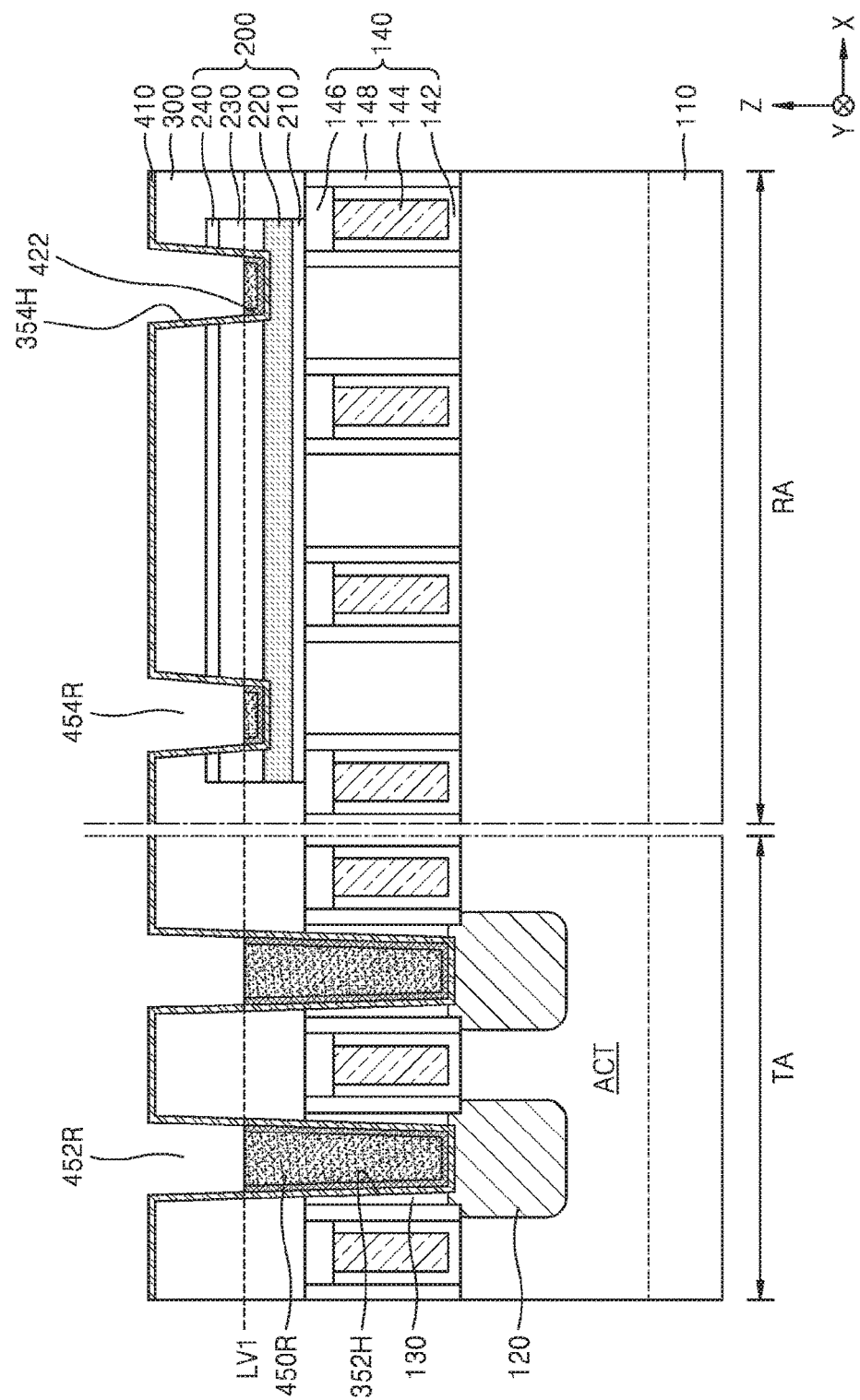

Referring to FIGS. 15 and 16, the second spacer layer 422 may be formed by performing an etching process of removing a portion of the second preliminary spacer layer 420 exposed by the mold layer 450R. The first preliminary spacer layer 410 may be exposed at a portion thereof from which the portion of the second preliminary spacer layer 420 is removed. During the etching process, the first preliminary spacer layer 410 may have high etch selectivity with respect to the second preliminary spacer layer 420. Thus, during a process of forming the second spacer layer 422, the first preliminary spacer layer 410 may not be removed.

Thus, during a process of removing the portion of the second preliminary spacer layer 420 in the resistor area RA, the first preliminary spacer layer 410 may remain covering the etch stop pattern 230. Thus, during removal of the portion of the second preliminary spacer layer 420, a portion of the etch stop pattern 230 may be less likely to (or, alternatively, prevented) from being removed.

In some example embodiments, during a process of forming the second spacer layer 422, when a portion of the first preliminary spacer layer 410 is removed and a thickness of the first preliminary spacer layer 410 is reduced, the resistor contact spacer 400B may be formed as shown in FIG. 2B or 2D.

Figure 17:
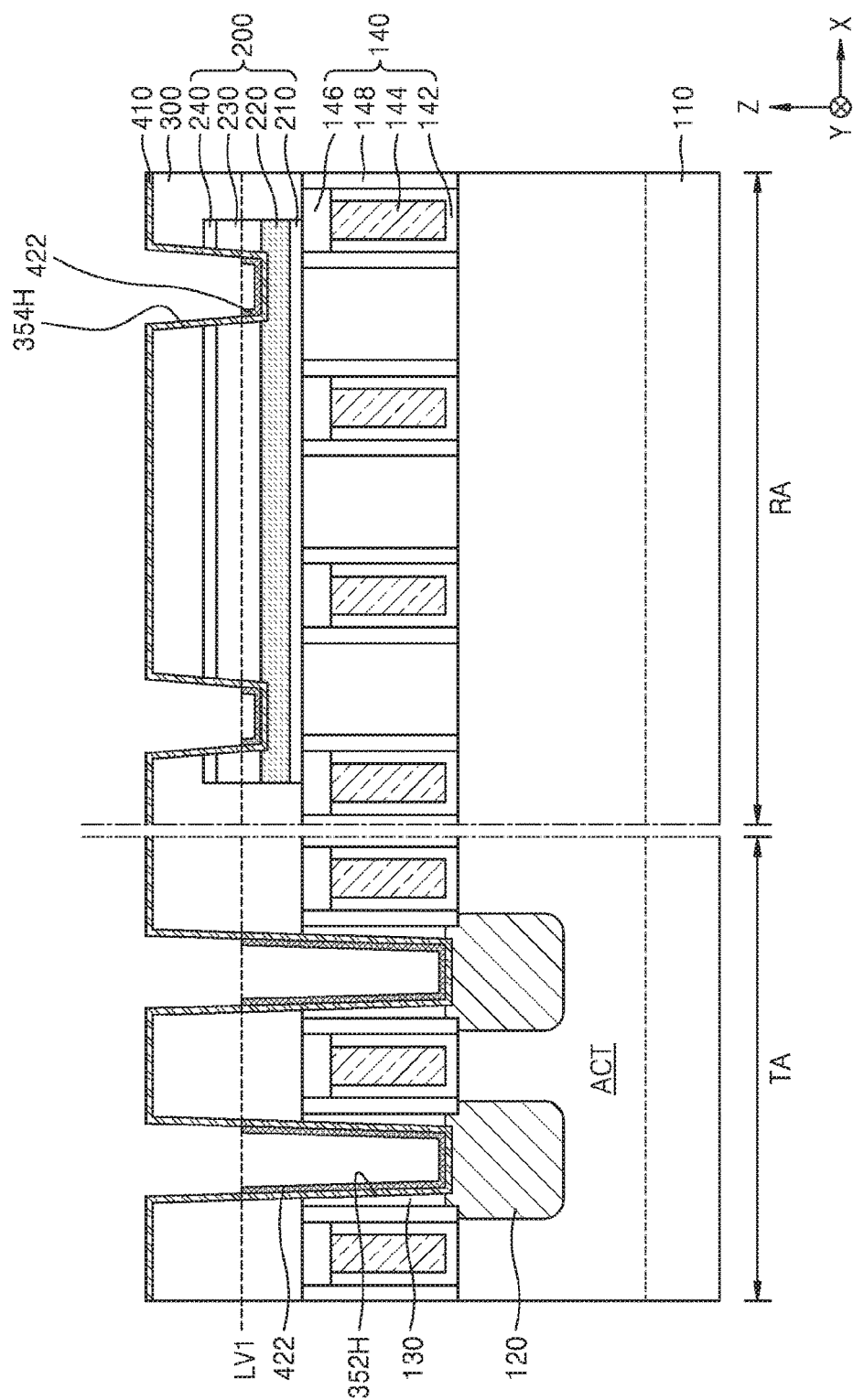

Referring to FIGS. 16 and 17, the mold layer 450R may be wholly removed after the second spacer layer 422 is formed.

Figure 18:
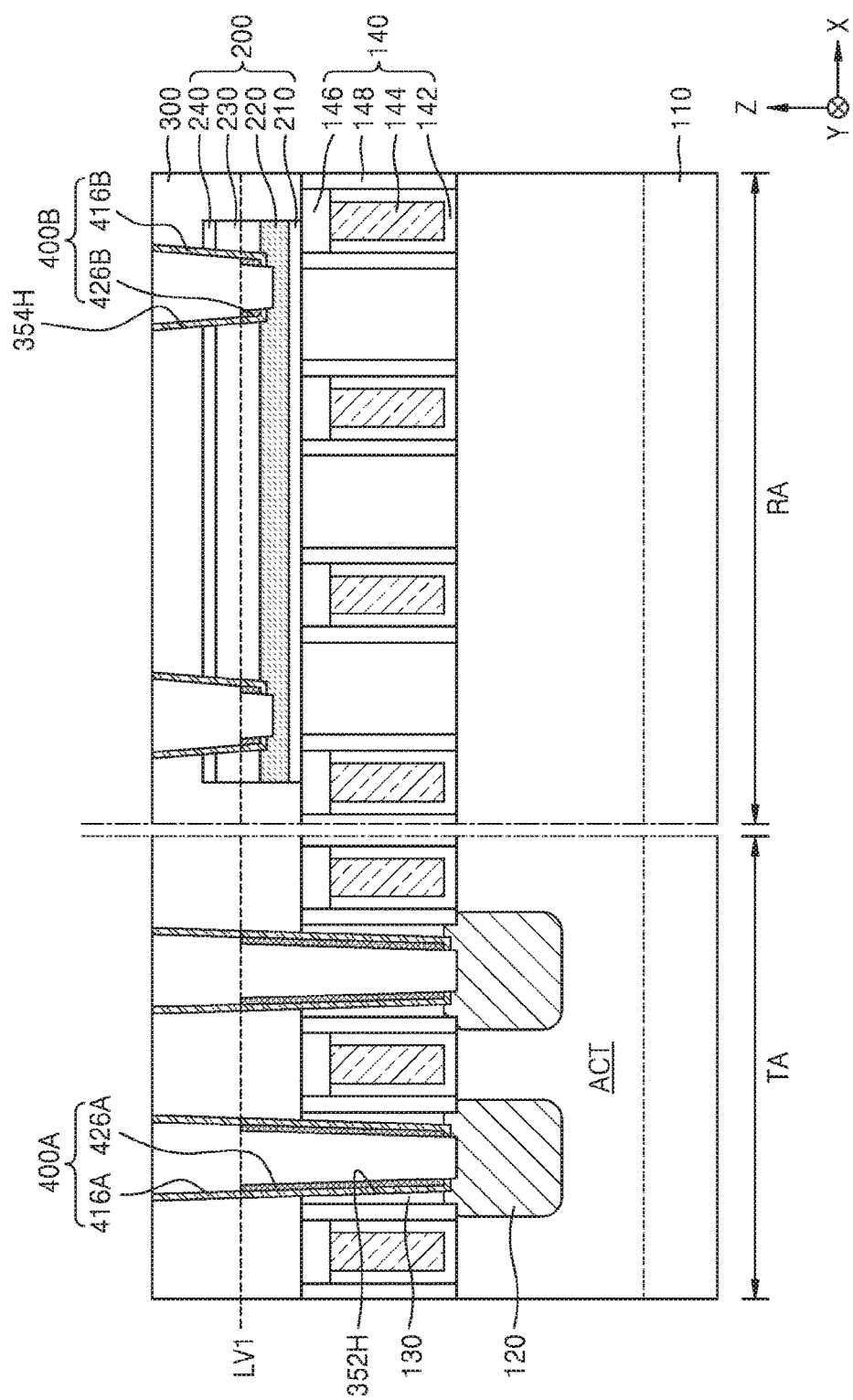

Referring to FIGS. 17 and 18, the first transistor contact spacer layer 416A and the first resistor contact spacer 416B may be formed by removing a portion of the first preliminary spacer layer 410, and the second transistor contact spacer layer 426A and the second resistor contact spacer layer 426B may be formed by removing a portion of the second spacer layer 422. The first transistor contact spacer layer 416A, the first resistor contact spacer 416B, the second transistor contact spacer layer 426A, and the second resistor contact spacer layer 426B may be formed by anisotropically etching the first preliminary spacer layer 410 and the second spacer layer 422. Specifically, the first transistor contact spacer layer 416A and the first resistor contact spacer 416B may be respectively formed in the transistor area TA and the resistor area RA by removing a portion of the first preliminary spacer layer 410 disposed on a bottom surface of the transistor contact hole 352H and a bottom surface of the resistor contact hole 354H, and the second transistor contact spacer layer 426A and the second resistor contact spacer layer 426B may be respectively formed in the transistor area TA and the resistor area RA by removing a portion of the second spacer layer 422 disposed on the bottom surface of the transistor contact hole 352H and the bottom surface of the resistor contact hole 354H.

Thereby, the transistor contact spacer 400A including the first transistor contact spacer layer 416A and the second transistor contact spacer layer 426A may be formed in the transistor area TA, and the resistor contact spacer 400B including the first resistor contact spacer 416B and the second resistor contact spacer layer 426B may be formed in the resistor area RA.

In some example embodiments, during a process of forming the transistor contact spacer 400A and the resistor contact spacer 400B, when a portion of each of the first transistor contact spacer layer 416A and the first resistor contact spacer 416B is removed and a thickness thereof is reduced, the resistor contact spacer 400B may be formed as shown in FIG. 2B or 2D.

In some example embodiments, during a process of forming the transistor contact spacer 400A and the resistor contact spacer 400B, when a portion of a top end of each of the first transistor contact spacer layer 416A, the second transistor contact spacer layer 426A, the first resistor contact spacer 416B, and the second resistor contact spacer layer 426B is removed, the resistor contact spacer 400B may be formed as shown in FIG. 2C or 2D.

Figure 19:
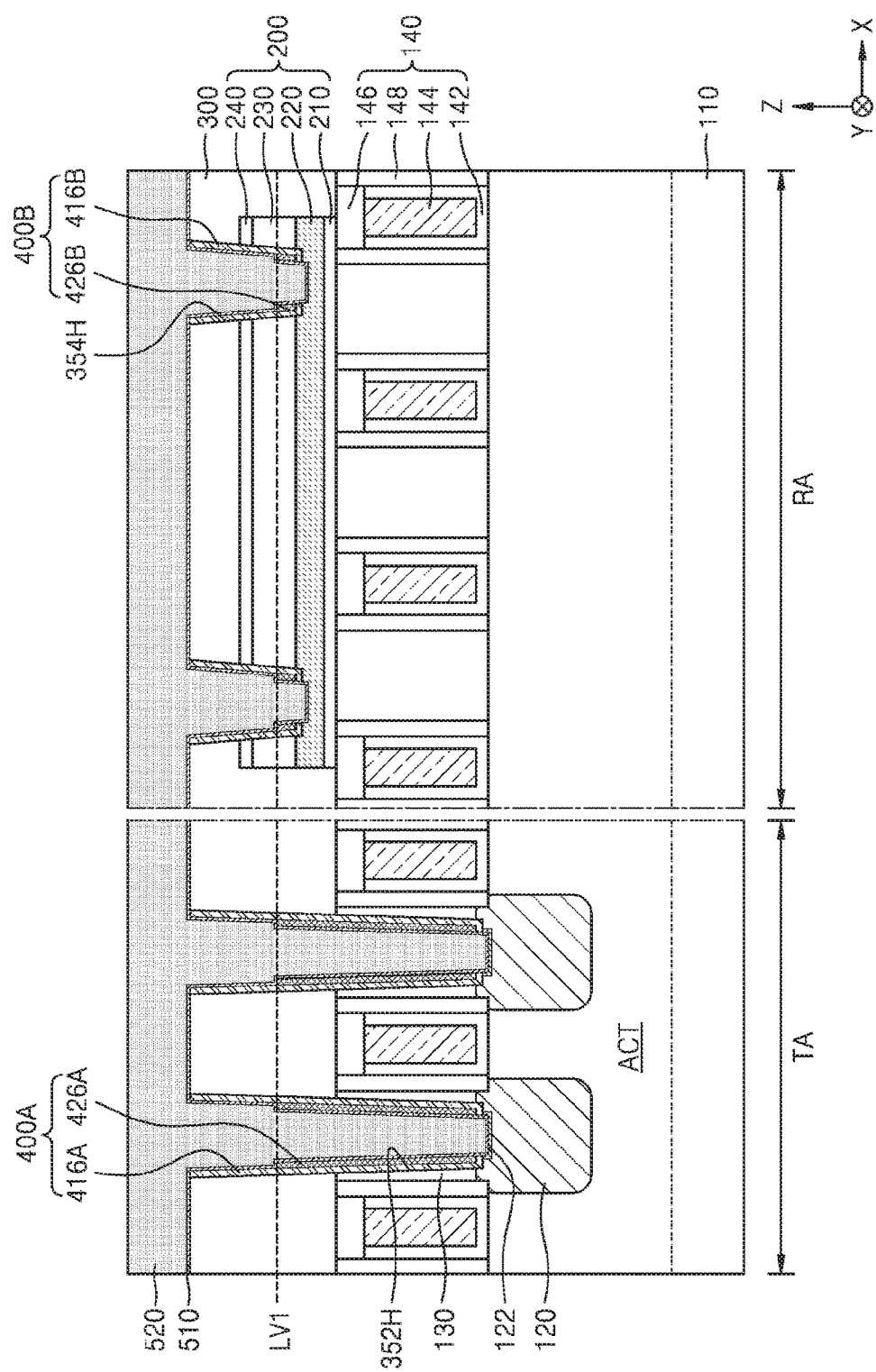

Referring to FIG. 19, a barrier layer 510 conformally covering an inner surface of the transistor contact hole 352H, an inner surface of the resistor contact hole 354H, and the upper interlayer insulating layer 300; and a core layer 520 filling the transistor contact hole 352H and the resistor contact hole 354H may be formed.

Thereafter, the semiconductor device 100 including the transistor contact structure 500A and the resistor contact structure 500B in the transistor area TA and the resistor area RA respectively as shown in FIG. 1 may be formed by removing a portion of the core layer 520 and a portion of the barrier layer 510 until the upper interlayer insulating layer 300 is exposed.

Figure 20:
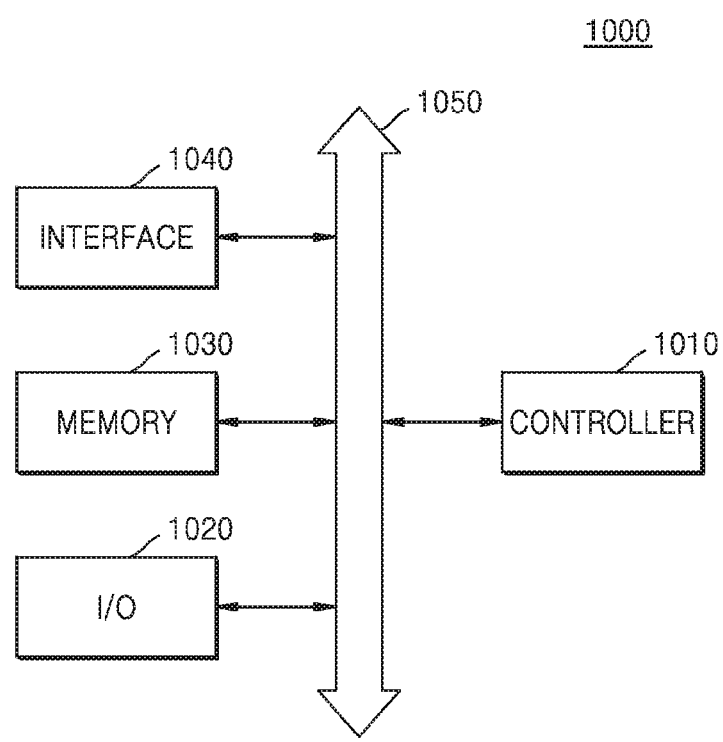
FIG. 20 is a block diagram of an electronic system according to an example embodiment.

FIG. 20 is a block diagram of an electronic system 1000 according to an example embodiment.

Referring to FIG. 20, the electronic system 1000 includes a controller 1010, an input/output (I/O) device 1020, a memory 1030, and an interface 1040, which are connected to each other through a bus 1050.

The controller 1010 may include at least one of a microprocessor, a digital signal processor, and a processing device similar thereto. The I/O device 1020 may include at least one of a keypad, a keyboard, and a display. The memory 1030 may be used to store commands executed by the controller 1010. For example, the memory 1030 may be used to store user data.

The electronic system 1000 may include a wireless communication device or a device capable of transmitting and/or receiving information in a wireless environment. The interface 1040 may be a wireless interface for transmitting/receiving data through a wireless communication network in the electronic system 1000. The interface 1040 may include an antenna and/or a wireless transceiver. In some example embodiments, the electronic system 1000 may use a communication interface protocol of a $3^{rd}$ generation communication system, such as code division multiple access (CDMA), global system for mobile communication (GSM), North American digital cellular (NADC), extended-time division multiple access (E-TDMA), and/or wide band code division multiple access (WCDMA). The electronic system 1000 may include at least one of the semiconductor devices described above with reference to FIGS. 1 through 19 and semiconductor devices manufactured by methods described above with reference to FIGS. 1 through 19 and methods modified therefrom, within the range of the technical ideas of the inventive concepts.

While example embodiments of the inventive concepts have been particularly shown and described with reference to some example embodiments thereof, it will be understood that various changes in form and details may be made therein without departing from the spirit and scope of the following claims.

What is claimed is:

1. A semiconductor device comprising:
   a lower interlayer insulating layer on a substrate, the substrate including a resistor area;
   a resistor structure including a resistor layer and an etch stop pattern sequentially stacked, in the resistor area, on the lower interlayer insulating layer;
   an upper interlayer insulating layer configured to cover the resistor structure and on the lower interlayer insulating layer;
   a resistor contact structure configured to pass through the upper interlayer insulating layer and the etch stop pattern and contact the resistor layer; and
   a resistor contact spacer between the upper interlayer insulating layer, the etch stop pattern, and the resistor contact structure, the resistor contact spacer including,
   a first resistor contact spacer, and
   a second resistor contact spacer between the first resistor contact spacer and the resistor contact structure, a top end of the second resistor contact spacer being lower than a top end of the first resistor contact spacer relative to the substrate.

2. The semiconductor device of claim 1, wherein the first resistor contact spacer includes an oxide, and the second resistor contact spacer includes a nitride.

3. The semiconductor device of claim 1, wherein side surfaces of a top portion of the resistor contact structure contacts the first resistor contact spacer, and side surfaces of a bottom portion of the resistor contact structure contact the second resistor contact spacer.

4. The semiconductor device of claim 1, wherein a top end of the second resistor contact spacer is located at a level between bottom and top surfaces of the etch stop pattern.

5. The semiconductor device of claim 1, wherein the top end of the first resistor contact spacer is at a same level as a top surface of the upper interlayer insulating layer.

6. The semiconductor device of claim 1, wherein the substrate includes the resistor area and a transistor area, and the semiconductor device further comprises:
   a plurality of gate structures on the substrate in the transistor area and the resistor area, the plurality of gate structures having side walls covered by the lower interlayer insulating layer;
   an impurity area between portions of the substrate between the plurality of gate structures of the transistor area;
   a transistor contact structure configured to pass through the upper interlayer insulating layer and the lower interlayer insulating layer and contact the impurity area; and a transistor contact spacer between the upper interlayer insulating layer, the lower interlayer insulating layer, and the transistor contact structure, the transistor contact spacer including,
a first transistor contact spacer, and
a second transistor contact spacer between the first transistor contact spacer and the transistor contact structure, a top end of the second transistor contact spacer being at a level lower than a top end of the first transistor contact spacer relative to the substrate.

7. The semiconductor device of claim 6, wherein the first transistor contact spacer and the second transistor contact spacer respectively comprise same materials as the first resistor contact spacer and the second resistor contact spacer.

8. The semiconductor device of claim 6, wherein the top end of second resistor contact spacer and the top end of the second transistor contact spacer are at a same level.

9. The semiconductor device of claim 1, wherein the resistor structure further comprises:
a lower buffer insulating pattern between the lower interlayer insulating layer and the resistor layer.

10. The semiconductor device of claim 1, wherein the resistor structure further comprises:
an upper buffer insulating pattern between the upper interlayer insulating layer and the etch stop pattern, and wherein
the resistor contact structure passes through the upper interlayer insulating layer, the upper buffer insulating pattern, and the etch stop pattern.

11. The semiconductor device of claim 1, wherein the etch stop pattern comprises a nitride.

12. The semiconductor device of claim 1, wherein a bottom end of the second resistor contact spacer contacts the first resistor contact spacer, and the top end of the second resistor contact spacer contacts the resistor contact structure.

13. The semiconductor device of claim 1, wherein the resistor structure and the etch stop pattern are spaced apart from each other with the first resistor contact spacer therebetween.

14. A semiconductor device comprising:
a lower interlayer insulating layer configured to cover a plurality of gate structures and side walls of the plurality of gate structures, the plurality of gate structures being on a substrate, the substrate including a transistor area and a resistor area;
a resistor structure including a resistor layer and an etch stop pattern sequentially stacked, in the resistor area, on the plurality of gate structures and the lower interlayer insulating layer;
an upper interlayer insulating layer on the lower interlayer insulating layer so as to cover the resistor structure in the transistor area and the resistor area;
contact structures including a resistor contact structure and a transistor contact structure, the resistor contact structure configured to pass through the upper interlayer insulating layer and the etch stop pattern and contact the resistor layer, and the transistor contact structure configured to pass through the upper interlayer insulating layer and the lower interlayer insulating layer and contact the substrate;
a resistor contact spacer between the upper interlayer insulating layer, the etch stop pattern, and the resistor contact structure, the resistor contact spacer including a first resistor contact spacer and a second resistor contact spacer, the second resistor contact spacer being between the first resistor contact spacer and the resistor contact structure, a top end of the second resistor contact spacer being located at a lower level than a top end of the first resistor contact spacer; and
a transistor contact spacer between the upper interlayer insulating layer, the etch stop pattern, and the transistor contact structure, the transistor contact spacer including a first transistor contact spacer and a second transistor contact spacer, the second transistor contact spacer being between the first transistor contact spacer and the transistor contact structure, a top end of the second transistor contact spacer being located at a lower level than a top end of the first transistor contact spacer.

15. The semiconductor device of claim 14, wherein
the top end of the second resistor contact spacer is between bottom and top surfaces of the etch stop pattern, and
the top end of the second transistor contact spacer is between bottom and top surfaces of the upper interlayer insulating layer.

16. A semiconductor device comprising:
a plurality of resistor contact spacers each including a first resistor contact spacer and a second resistor contact spacer, the second resistor contact spacer being between the first resistor contact spacer and a respective one of a plurality of resistor contact structures, a top end of the second resistor contact spacer being located at a lower level than a top end of the first resistor contact spacer; and
a plurality of transistor contact spacers each including a first transistor contact spacer and a second transistor contact spacer, the second transistor contact spacer being between the first transistor contact spacer and a respective one of a plurality of transistor contact structures, a top end of the second transistor contact spacer being located at a lower level than a top end of the first transistor contact spacer.

17. The semiconductor device of claim 16, wherein
a top portion of the plurality of transistor contact structures are landing pad for components on respective ones of the plurality of transistor contact structures, a horizontal cross-sectional area of the plurality of transistor contact spacers is same amongst each of the plurality of transistor contact spacers, and
a top portion of the plurality of resistor contact structures are landing pads for components on respective ones of the plurality of resistor contact structures, a horizontal cross-sectional area of the plurality of resistor contact spacers is same amongst each of the plurality of resistor contact spacers.

18. The semiconductor device of claim 16, further comprising:
a substrate having a resistor area and a transistor area;
a lower interlayer insulating layer on the substrate;
a resistor structure including a resistor layer and an etch stop pattern sequentially stacked on the lower interlayer insulating layer in the resistor area of the substrate; and
an upper interlayer insulating layer configured to cover the resistor structure in the transistor area and the resistor area, wherein
the plurality of resistor contact structures are configured to pass through the upper interlayer insulating layer and the etch stop pattern and contact the resistor layer, and
the plurality of transistor contact structures are configured to pass through the upper interlayer insulating layer and the lower interlayer insulating layer and contact an impurity area in the substrate.

19. The semiconductor device of claim 18, wherein
the first resistor contact spacer includes an oxide such that
  the etch stop pattern is protected by an oxide spacer,
  and
the second resistor contact spacer includes a nitride.

20. The semiconductor device of claim 18, wherein the plurality of resistor contact structures and the resistor layer are configured to form resistor devices, each of the resistor devices having a same resistance value.

* * * * *